(12) United States Patent
Iwao et al.

(10) Patent No.: US 12,300,745 B2
(45) Date of Patent: May 13, 2025

(54) COMPOUND SEMICONDUCTOR DEVICE AND METHOD OF MANUFACTURING COMPOUND SEMICONDUCTOR DEVICE

(71) Applicant: SONY SEMICONDUCTOR SOLUTIONS CORPORATION, Kanagawa (JP)

(72) Inventors: Akito Iwao, Kumamoto (JP); Yoshikazu Motoyama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 284 days.

(21) Appl. No.: 17/758,300

(22) PCT Filed: Nov. 26, 2020

(86) PCT No.: PCT/JP2020/044110
§ 371 (c)(1),
(2) Date: Jun. 30, 2022

(87) PCT Pub. No.: WO2021/140776
PCT Pub. Date: Jul. 15, 2021

(65) Prior Publication Data
US 2023/0036228 A1    Feb. 2, 2023

(30) Foreign Application Priority Data
Jan. 8, 2020    (JP) .................................. 2020-001337

(51) Int. Cl.
*H01L 29/778*    (2006.01)
*H01L 29/06*    (2006.01)
(Continued)

(52) U.S. Cl.
CPC ........ *H01L 29/778* (2013.01); *H01L 29/0607* (2013.01); *H01L 29/0843* (2013.01); *H01L 29/1095* (2013.01); *H01L 29/66431* (2013.01)

(58) Field of Classification Search
CPC ............. H01L 29/0607; H01L 29/0843; H01L 29/1095; H01L 29/66431;
(Continued)

(56) References Cited

U.S. PATENT DOCUMENTS 4,714,948 A    12/1987    Mimura et al.
2011/0057233 A1*    3/2011    Park .................... H01L 29/1033
257/E21.403

(Continued)

FOREIGN PATENT DOCUMENTS

CN    104143569 A    11/2014
EP    0064829 A2    11/1982
(Continued)

OTHER PUBLICATIONS

International Search Report and Written Opinion of PCT Application No. PCT/JP2020/044110, issued on Mar. 2, 2021, 09 pages of ISRWO.

*Primary Examiner* — Shahed Ahmed
(74) *Attorney, Agent, or Firm* — CHIP LAW GROUP

(57) ABSTRACT

Provided is a compound semiconductor device that can suppress the deterioration of the element characteristics and a method of manufacturing a compound semiconductor device. The compound semiconductor device includes a laminated body constituted of a compound semiconductor and including a channel layer in which a first conductivity type carrier runs; a gate electrode provided on an upper surface side of the laminated body; a source electrode provided on the upper surface side of the laminated body; and a drain electrode provided on the upper surface side of the laminated body. The laminated body includes a second (Continued)

conductivity type first low resistance layer that is provided at a position facing the gate electrode and is in contact with the gate electrode, a first electric-field relaxation layer extended from the first low resistance layer toward a side of one of the source electrode and the drain electrode and configured to relax electric field concentration to the first low resistance layer, and a first amorphous layer covering a first side surface that is a side surface of the first electric-field relaxation layer and faces one of the source electrode and the drain electrode.

6 Claims, 19 Drawing Sheets

(51) Int. Cl.
| | | |
|---|---|---|
| *H01L 29/08* | (2006.01) | |
| *H01L 29/10* | (2006.01) | |
| *H01L 29/66* | (2006.01) | |

(58) Field of Classification Search
CPC ......... H01L 29/778–7789; H01L 29/122–127; H01L 29/15–158; H01L 29/66462; H01L 29/1604; H01L 29/185; H01L 21/02592; H01L 29/0619; H01L 29/1066; H01L 29/41766

See application file for complete search history.

(56) References Cited

U.S. PATENT DOCUMENTS

| | | |
|---|---|---|
| 2013/0077352 A1 | 3/2013 | Shimizu et al. |
| 2014/0159117 A1* | 6/2014 | Taniguchi ........... H01L 29/4232 257/194 |
| 2014/0335800 A1 | 11/2014 | Takeuchi et al. |
| 2015/0236121 A1* | 8/2015 | Chiu ................. H01L 21/02505 257/194 |
| 2016/0087038 A1* | 3/2016 | Takeuchi .......... H04W 52/0229 257/190 |
| 2018/0097096 A1 | 4/2018 | Sugiyama et al. |

FOREIGN PATENT DOCUMENTS

| | | |
|---|---|---|
| JP | 57-176772 A | 10/1982 |
| JP | 2017-201699 A | 11/2017 |
| JP | 2018-060847 A | 4/2018 |
| JP | 6369605 B2 | 8/2018 |
| TW | 201631767 A | 9/2016 |
| TW | 201639167 A | 11/2016 |
| WO | 2011/132284 A1 | 10/2011 |

* cited by examiner

COMPOUND SEMICONDUCTOR DEVICE AND METHOD OF MANUFACTURING COMPOUND SEMICONDUCTOR DEVICE

CROSS REFERENCE TO RELATED APPLICATIONS

This application is a U.S. National Phase of International Patent Application No. PCT/JP2020/044110 filed on Nov. 26, 2020, which claims priority benefit of Japanese Patent Application No. JP 2020-001337 filed in the Japan Patent Office on Jan. 8, 2020. Each of the above-referenced applications is hereby incorporated herein by reference in its entirety.

TECHNICAL FIELD

The present disclosure relates to a compound semiconductor device and a method of manufacturing a compound semiconductor device.

BACKGROUND ART

In recent years, field effect transistors (FETs) having channel layers constituted of compound semiconductors are being developed. For example, HEMTs (High Electron Mobility Transistors) are applied to switch elements. Furthermore, a structure that relaxes the electric field concentration to a first P-type diffusion layer by providing the first P-type diffusion layer between an N-type channel layer and a gate electrode and further continuously providing a second P-type diffusion layer with a lower P-type impurity concentration than the first P-type diffusion layer on the outside of the first P-type diffusion layer has been known (for example, see PTL 1). This structure is expected to be applied to power device elements.

CITATION LIST

Patent Literature

[PTL 1]
JP 6369605 B

SUMMARY

Technical Problem

Dry etching treatment applied to the second P-type diffusion layer during a HEMT production process allows hydrogen ions with kinetic energy, which are generated in a dry etching apparatus, to be implanted into an exposed side surface of the second P-type diffusion layer. Implantation of hydrogen in the second P-type diffusion layer may allow the implanted hydrogens to be linked with an acceptor (for example, carbon or the like) in the second P-type diffusion layer to inactivate the acceptor and change the acceptor concentration of the second P-type diffusion layer. Change of the acceptor concentration of the second P-type diffusion layer may interfere with the designed function of an electric-field relaxation structure including a second P-type diffusion layer and deteriorate the element characteristics such as lowering the pressure resistance of a HEMT due to the electric field concentration to a first P-type diffusion layer (hereinafter referred to as a first low resistance layer).

The present disclosure has been completed in consideration of such circumstances and has an object to provide a compound semiconductor device that can suppress the deterioration of element characteristics and a method of manufacturing a compound semiconductor device.

Solution to Problem

A compound semiconductor device according to one aspect of the present disclosure includes a laminated body constituted of a compound semiconductor and including a channel layer in which a first conductivity type carrier runs; a gate electrode provided on an upper surface side of the laminated body; a source electrode provided on the upper surface side of the laminated body; and a drain electrode provided on the upper surface side of the laminated body. The laminated body includes a second conductivity type first low resistance layer that is provided at a position facing the gate electrode and is in contact with the gate electrode; a first electric-field relaxation layer extended from the first low resistance layer toward a side of one of the source electrode and the drain electrode and configured to relax the electric field concentration to the first low resistance layer; and a first amorphous layer covering a first side surface that is a side surface of the first electric-field relaxation layer and faces one of the source electrode and the drain electrode.

This enables the first amorphous layer to prevent hydrogen ions and the like with kinetic energy, which are generated due to the process, from being implanted into the inside of the first electric-field relaxation layer from the first side surface of the first electric-field relaxation layer even when hydrogen ions are generated due to the process during forming an opening (for example, a drain opening) for placing one of the source electrode and the drain electrode. The first amorphous layer can suppress the inactivation of the impurities (for example, carbon or the like) in the first electric-field relaxation layer by the above hydrogen ions or the like. This enables the compound semiconductor device to stabilize the activation ratio of impurities in the first electric-field relaxation layer and relax the electric field concentration to the first low resistance layer with high reliability. This enables the compound semiconductor device to suppress the deterioration of element characteristics (such as a pressure resistance reduction due to the electric field concentration to the first low resistance layer).

A method of manufacturing a compound semiconductor device according to one aspect of the present disclosure includes a step of forming a laminated body constituted of a compound semiconductor and including a channel layer in which a first conductivity type carrier runs; a step of forming a gate electrode on an upper surface side of the laminated body; a step of forming a source electrode provided on the upper surface side of the laminated body; and a step of forming a drain electrode provided on the upper surface side of the laminated body. The step of forming a laminated body includes a step of forming a second conductivity type first low resistance layer that is placed at a position facing the gate electrode and is in contact with the gate electrode; a step of forming a first electric-field relaxation layer extended from the first low resistance layer toward a side of one of the source electrode and the drain electrode and configured to relax the electric field concentration to the first low resistance layer; and a step of forming a first amorphous layer so as to cover a first side surface that is a side surface of the first electric-field relaxation layer and faces one of the source electrode and the drain electrode. In the step of forming a first amorphous layer, the first amorphous layer is formed by partially ion-implanting an impurity into the first electric-field relaxation layer to amorphize.

This enables the manufacture of a compound semiconductor device with a stable activation rate of impurities in the first electric-field relaxation layer and less-deteriorated element characteristics.

DESCRIPTION OF EMBODIMENTS

Embodiments of the present disclosure will be described hereinafter with reference to the drawings. In the descriptions of the drawings referenced in the following explanations, the same or similar portions are denoted by the same or similar reference signs. However, it should be noted that the drawings are schematic, and the relationships between thicknesses and planar dimensions, ratios of thicknesses of respective layers, and the like are different from actual ones. Therefore, specific thicknesses and dimensions should be determined by considering the following descriptions. In addition, it is of course that the drawings include portions where mutual dimensional relationships and ratios differ between the drawings.

It is to be understood that definitions of directions such as upward, downward, and the like in the following description are merely definitions provided for the convenience of explanation and are not intended as limiting technical ideas of the present disclosure. For example, it is of course that when an object is observed after being rotated 90°, upward and downward directions are interpreted as being converted into leftward and rightward directions, and when an object is observed after being rotated 180°, upward and downward directions are interpreted as being inverted.

The following descriptions give a case where a first conductivity type is N-type and a second conductivity type is P-type, as an example. However, the conductivity types may be selected in an inverse relationship, with the first conductivity type being P-type and the second conductivity type being N-type.

First Embodiment (Configuration Example of Compound Semiconductor Device)

Figure 1:
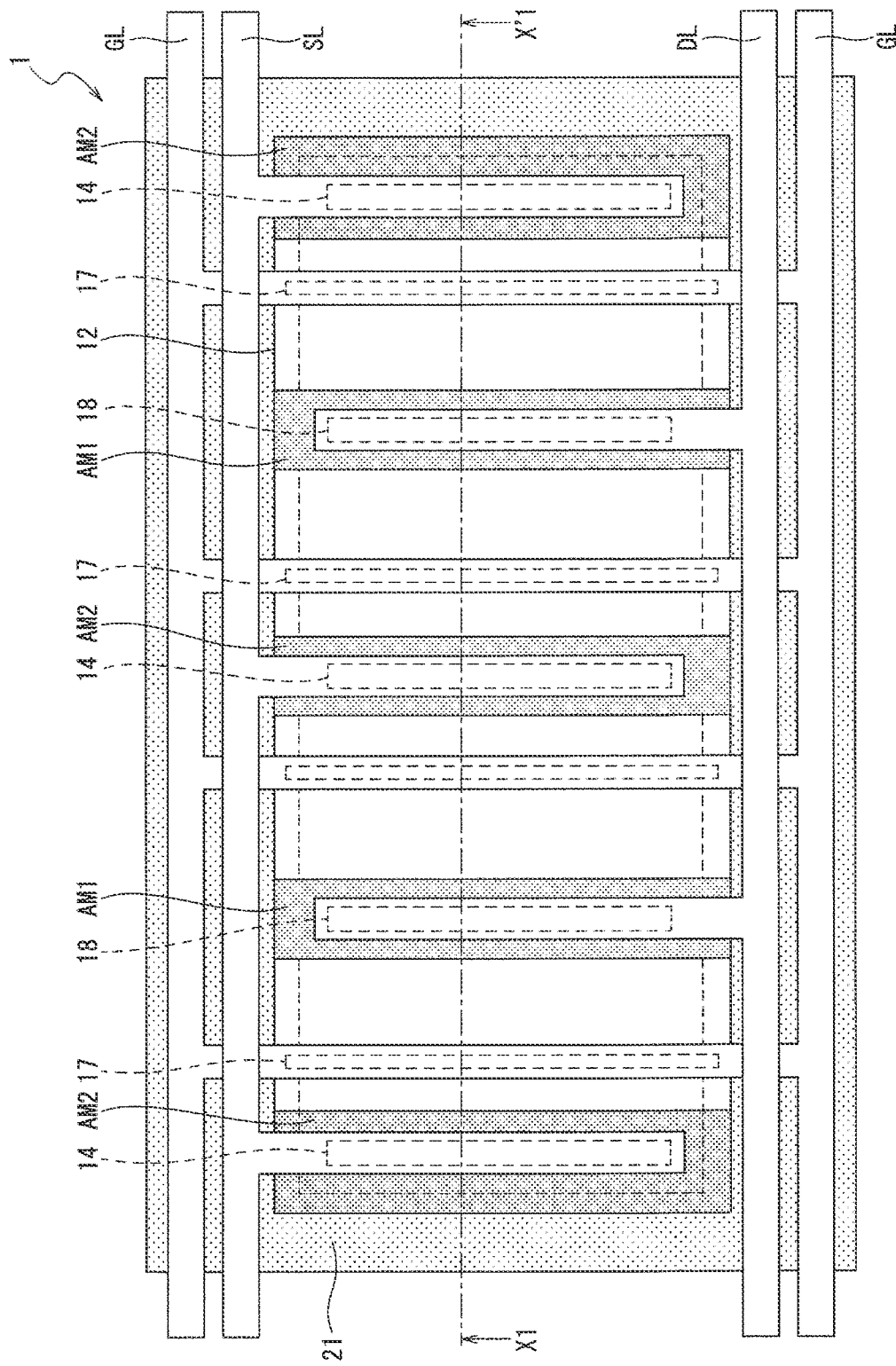
FIG. 1 is a plan view illustrating a configuration example of the compound semiconductor device 1 according to a first embodiment of the present disclosure.
Figure 2:
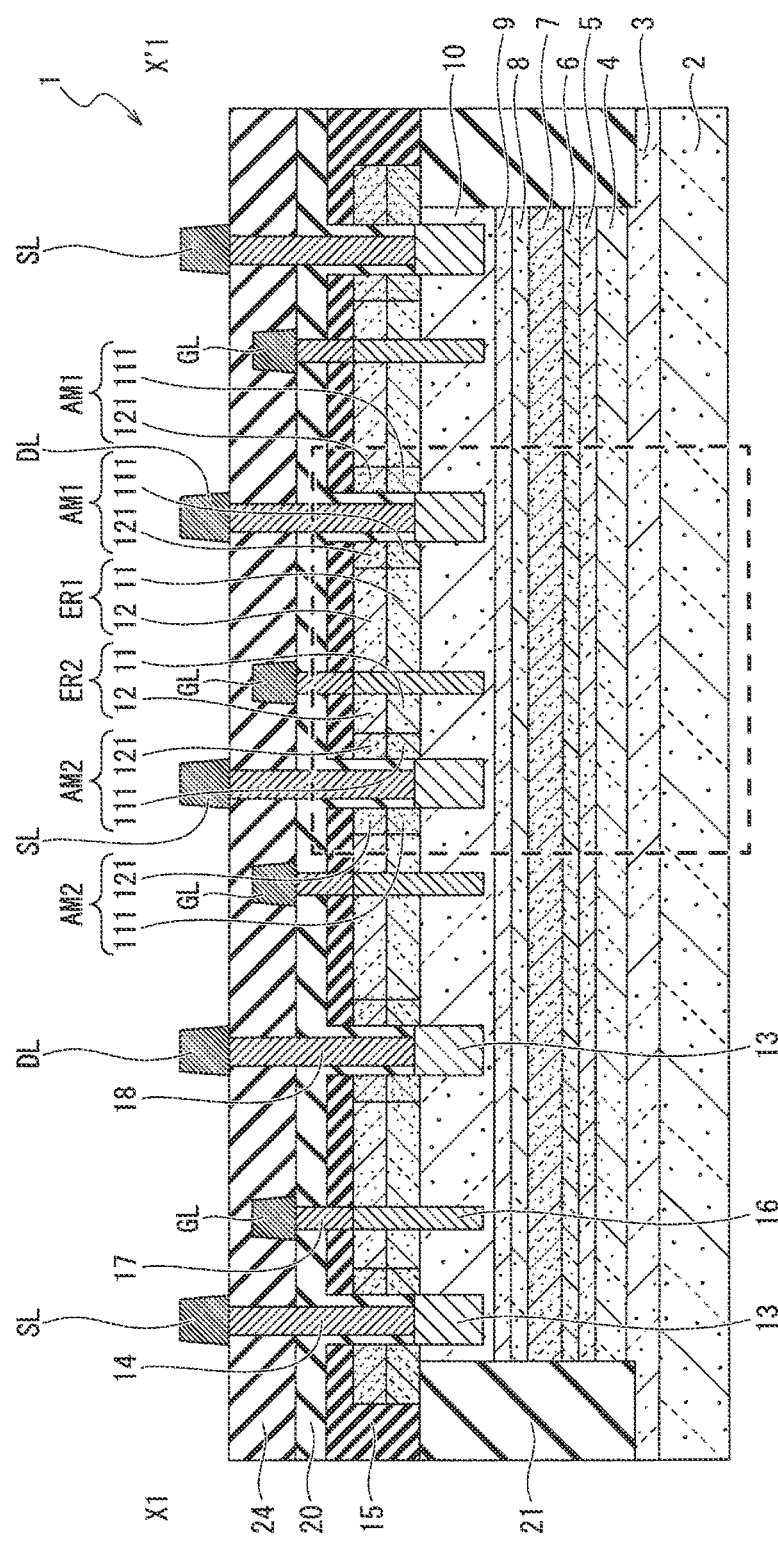
FIG. 2 is a cross-sectional view illustrating a configuration example of the compound semiconductor device 1 according to the first embodiment of the present disclosure.
Figure 3:
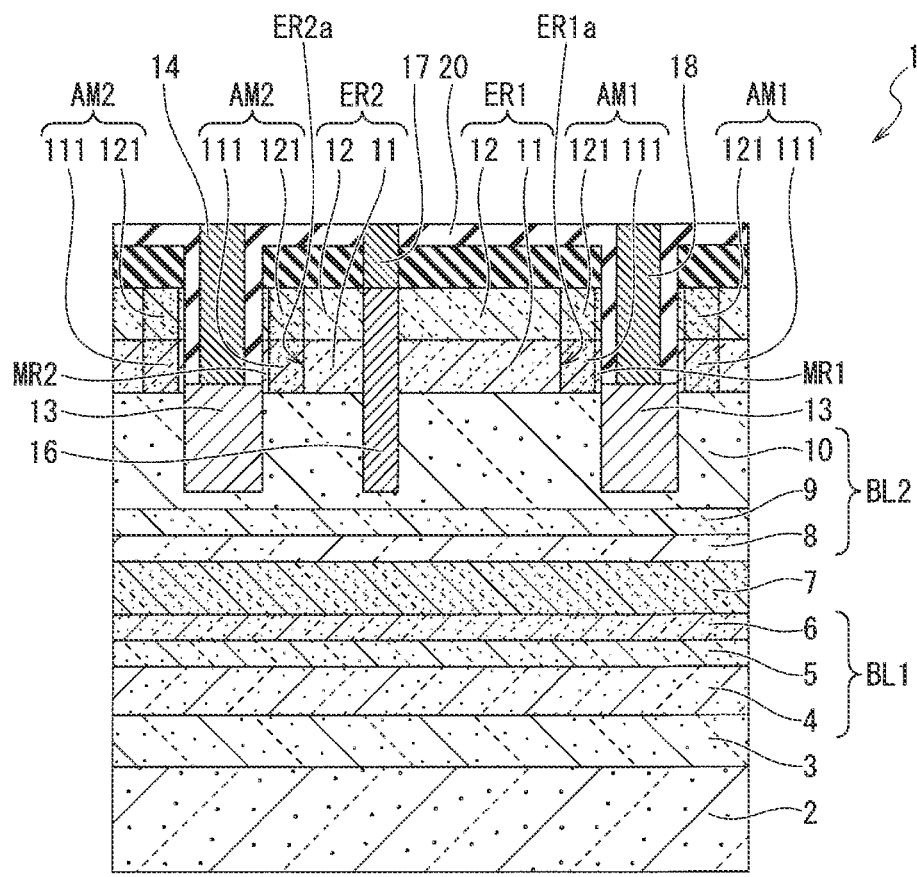
FIG. 3 is a cross-sectional view illustrating a configuration example of the compound semiconductor device 1 according to the first embodiment of the present disclosure.

FIG. 1 is a plan view illustrating a configuration example of a compound semiconductor device 1 according to a first embodiment of the present disclosure. FIGS. 2 and 3 are cross-sectional views illustrating a configuration example of the compound semiconductor device 1 according to the first embodiment of the present disclosure. FIG. 2 illustrates a cross-section of the plan view illustrated in FIG. 1 taken along line X1-X'1. FIG. 3 illustrates an area surrounded by the broken lines in FIG. 2 in an enlarged form. In FIG. 1, illustrations of the first interlayer insulation film 15, the second interlayer insulation film 20, and the third interlayer insulation film 24, which are illustrated in FIG. 2, are omitted to avoid the complication of the drawings.

As illustrated in FIG. 1 to FIG. 3, the compound semiconductor device 1 includes a laminated body constituted of a compound semiconductor, and a source electrode 14, a gate electrode 17, and a drain electrode 18, which are provided on the upper surface side of the laminated body. The laminated body includes a channel layer 7 in which electrons, N-type (one example of the "first conductivity type" of the present disclosure) carriers, travel. The compound semiconductor device 1 is a HEMT that includes a barrier layer (for example, an upper barrier layer BL2, which will be described later) between the gate electrode 17 and the channel layer 7 and has a P-type (one example of the "second conductivity type" of the present disclosure) gate diffusion layer 16 (one example of the "first low resistance layer" of the present disclosure) in the barrier layer.

FIG. 1 illustrates a case where the compound semiconductor device 1 includes a multigate transistor. In the present description, a multigate transistor refers to a transistor having a plurality of gate electrodes. For example, a multigate transistor includes a plurality of source electrodes 14, a plurality of gate electrodes 17, and a plurality of drain electrodes 18, and a plurality of transistors align side-by-side in one direction (for example, the left-right direction in FIG. 1) so as to alternately share a source electrode 14 and a drain electrode 18. That is, a pair of gate electrodes 17 are provided on both sides of one source electrode 14, and a pair of gate electrodes 17 are provided on both sides of one drain electrode 18. A source electrode 14, a gate electrode 17, a drain electrode 18, and a gate electrode 17, which align in one direction, are taken as one set of electrode groups, and these electrode groups are repeatedly arranged in one direction.

As illustrated in FIGS. 2 and 3, the laminated body includes a substrate 2, a buffer layer 3 provided on the substrate 2, a lower barrier layer BL1 provided on the buffer layer 3, a channel layer 7 provided on the lower barrier layer BL1, an upper barrier layer BL2 provided on the channel layer 7, a P-type low resistance layer 11 (one example of the "second low resistance layer" of the present disclosure) provided on the upper barrier layer BL2, and a cap layer 12 (one example of the "high resistance layer" of the present disclosure) provided on the P-type low resistance layer 11. In the present description, a P-type low resistance layer 11 is also referred to as a P-Wing layer.

The lower barrier layer BL1 has a high resistance layer 4 provided on the buffer layer 3, a carrier supply layer 5 provided on the high resistance layer 4, and a high resistance layer 6 provided on the carrier supply layer 5. The upper barrier layer BL2 includes a high resistance layer 8 provided on the channel layer 7, a carrier supply layer 9 provided on the high resistance layer 8, and a high resistance layer 10 provided on the carrier supply layer 9.

A P-type gate diffusion layer 16 (one example of the "first low resistance layer" of the present disclosure) that is in contact with the gate electrode 17 is provided in the high resistance layer 10, the P-type low resistance layer (P-Wing layer) 11, and the cap layer 12. The P-type gate diffusion layer 16 has a higher P-type impurity concentration and lower electric resistance than the P-Wing layer 11.

Ohmic metal layers 13 are provided in the high resistance layer 10. The ohmic metal layers 13 are provided on both sides of the gate diffusion layer 16 at positions away from the gate diffusion layer 16. The drain electrode 18 is in contact with an ohmic metal layer 13 positioned at one side of both sides of the gate diffusion layer 16, and the source electrode 14 is in contact with an ohmic metal layer 13 positioned at the other side.

In the P-Wing layer 11 and the cap layer 12, the part positioned between the gate diffusion layer 16 and the drain electrode 18 functions as a first electric-field relaxation layer ER1. The first electric-field relaxation layer ER1 is in contact with the gate diffusion layer 16. The first electric-field relaxation layer ER1 is extended from the gate diffusion layer 16 toward the drain electrode 18 side. The part positioned between the gate diffusion layer 16 and the source electrode 14 in the P-Wing layer 11 and the cap layer 12 functions as a second electric-field relaxation layer ER2. The second electric-field relaxation layer ER2 is in contact with the gate diffusion layer 16. The second electric-field relaxation layer ER2 is extended from the gate diffusion layer 16 toward the source electrode 14 side.

The compound semiconductor device 1 further includes a first amorphous layer AM1 that is provided between the first electric-field relaxation layer ER1 and the drain electrode 18 and covers the side surface of the first electric-field relaxation layer ER1. The first amorphous layer AM1 is, for example, a lower layer 111 (one example of the "first layer" of the present disclosure) containing the same material as the P-Wing layer 11 and an upper layer 121 (one example of the "second layer" of the present disclosure) provided on the lower layer 111 and containing the same material as the cap layer 12. The lower layer 111 is a layer into which impurities are ion-implanted into the P-Wing layer 11 and formed by amorphization. The upper layer 121 is a layer into which impurities are ion-implanted into the cap layer 12 and formed by amorphization. The space between the first electric-field relaxation layer ER1 and the drain electrode 18 is separated by the first amorphous layer AM1.

The compound semiconductor device 1 further includes a second amorphous layer AM2 that is provided between the second electric-field relaxation layer ER2 and the source electrode 14 and covers the side surface of the second electric-field relaxation layer ER2. For example, as with the first amorphous layer AM1, the second amorphous layer AM2 is also constituted of a lower layer 111 and an upper layer 121 provided on the lower layer 111. The space between the second electric-field relaxation layer ER2 and the source electrode 14 is separated by the second amorphous layer AM2.

The compound semiconductor device 1 further includes a first interlayer insulation film 15 provided on the laminated body, a second interlayer insulation film 20 provided on the first interlayer insulation film 15, and gate wirings GL provided on the second interlayer insulation film 20. A gate opening into which the gate electrode 17 is placed is provided in the first interlayer insulation film 15 and the second interlayer insulation film 20. The gate wirings GL are connected to the gate electrode 17 placed in the gate opening.

The compound semiconductor device 1 further includes a third interlayer insulation film 24 provided on the second interlayer insulation film 20, drain wirings DL provided on the third interlayer insulation film 24, and source wirings SL provided on the third interlayer insulation film 24. A drain opening into which the drain electrode 18 is placed and a source opening into which the source electrode 14 is placed are provided in the first interlayer insulation film 15, the second interlayer insulation film 20, and the third interlayer insulation film 24. The drain wirings DL are connected to the drain electrode 18 placed in the drain opening. The source wirings SL are connected to the source electrode 14 placed in the source opening.

As illustrated in FIG. 3, the compound semiconductor device 1 may include a first margin portion MR1 provided between the drain electrode 18 and the first amorphous layer AM1 and adjacent to the first amorphous layer AM1. The compound semiconductor device 1 may include a second margin portion MR2 provided between the source electrode 14 and the second amorphous layer AM2 and adjacent to the second amorphous layer AM2. The first margin portion MR1 has an identical structure to the first electric-field relaxation layer ER1. The second margin portion MR2 has an identical structure to the second electric-field relaxation layer ER2. For example, the first margin portion MR1 and the second margin portion MR2 each have a low resistance layer 11 and a cap layer 12 provided on the low resistance layer 11.

Securing space for providing the first margin portion MR1 in advance prevents the first amorphous layer AM1 from being etched even when there is some variation in the formed position or the opening diameter of the drain opening during forming the drain opening. Similarly, securing a space for providing the second margin portion MR2 in advance prevents the second amorphous layer AM2 from being etched even when there is some variation in the formed position or the opening diameter of the source opening during forming the source opening.

Specific Examples

Next, configurations of the parts of the compound semiconductor device 1 are described in detail with specific examples.

(a) Substrate

The substrate 2 is constituted of a semi-insulating compound semiconductor material. For example, the substrate 2 is constituted of a group III-V compound semiconductor material. As the substrate 2, a semi-insulating single-crystal GaAs substrate or a semi-insulating InP substrate is used.

(b) Buffer Layer

The buffer layer 3 is constituted of, for example, a compound semiconductor layer epitaxially grown on the substrate 2. The buffer layer 3 is a compound semiconductor that lattice-matches with the substrate 2 and the lower barrier layer BL1 favorably. For example, when the substrate 2 is constituted of a single-crystal GaAs substrate, an epitaxially grown layer of i-GaAs that is not doped with impurities (i- means that it is not doped with impurities; the same applies hereinafter) is used as the buffer layer 3.

(c) Lower Barrier Layer

The lower barrier layer BL1 lattice-matches with, for example, the buffer layer 3 and the upper channel layer 7 favorably and is constituted of a group III-V compound semiconductor material with a wider band gap than that of a compound semiconductor material constituting the channel layer 7. For example, an AlGaAs mixed crystal epitaxially grown layer is used as the lower barrier layer BL1. As one example, the lower barrier layer is constituted of an Al0.2Ga0.8As mixed crystal having an aluminum (Al) composition ratio in the group III elements of 0.2.

The lower barrier layer BL1 has a carrier supply layer 5 doped with impurities that supply carriers. For example, electrons are used as the carrier. The N-type carrier supply layer 5 doped with N-type impurities as impurities supplying electrons is provided in an intermediate portion in the film thickness direction of the lower barrier layer BL1. Silicon (Si) is used as an N-type impurity.

Regions sandwiching the carrier supply layer 5 in the film thickness direction in the lower barrier layer BL1 constitute the high resistance layers 4 and 6. The high resistance layers 4 and 6 are not doped with any impurities or are doped with a low-concentration N-type or P-type impurity. The high resistance layers 4 and 6 preferably have impurity concentrations of $1 \times 10^{17}$ numbers/cm$^3$ or lower and a resistivity of $1 \times 10^{-2}$ Ωcm or larger.

One example of a specific configuration of the lower barrier layer BL1 is as follows. The lower barrier layer BL1 includes a high resistance layer 4, a carrier supply layer 5, and a high resistance layer 6. The high resistance layer 4 having a film thickness of about 200 nm and not doped with any impurities is provided on the buffer layer 3 side. Above the high resistance layer 4, the carrier supply layer 5 having a film thickness of 4 nm and containing about $1.6 \times 10^{12}$ numbers/cm2 of silicon (Si) is stacked. Further above this carrier supply layer 5, the high resistance layer 6 having a film thickness of about 2 nm and not doped with any impurities is stacked.

(d) Channel Layer

The channel layer 7 functions as a current path of a transistor. This channel layer 7 is a layer in which carriers from the carrier supply layer 5 of the lower barrier layer BL1 and a carrier supply layer 9, which will be mentioned below, of the upper barrier layer BL2 are accumulated. The channel layer 7 is constituted of a compound semiconductor heterojoining to the lower barrier layer BL1 and lattice-matches with the lower barrier layer BL1 favorably. The channel layer 7 is constituted using a compound semiconductor having an energy band on the carrier-running side in the hetero-joined portion with the lower barrier layer BL1 closer to the intrinsic Fermi level in the channel layer than the energy band on the carrier-running side in the compound semiconductor material constituting the interface region of the lower barrier layer BL1. The lower barrier layer BL1 is constituted of a compound semiconductor having an energy band on the carrier-running side in the joined portion with the channel layer 7 farther away from the intrinsic Fermi level in the channel layer than that of the channel layer 7.

In other words, the channel layer 7 is constituted using a compound semiconductor having an energy band on the majority carrier-running side in the hetero-joined portion with the lower barrier layer BL1 closer to the energy band on the minority carrier-running side than the energy band on the majority carrier-running side in the compound semiconductor material constituting the interface region of the lower barrier layer BL1. The intrinsic Fermi level in the channel layer is located in the middle between the lowest energy of the conduction band of the channel layer 7 (hereinafter referred to as a conduction band energy Ec) and the highest energy of the valence band (hereinafter referred to as a valence band energy Ev).

When the carriers are electrons, the energy band on the carrier-running side is a conduction band. Thus, the channel layer 7 is constituted using a III-V group compound semiconductor material with at least a lower conduction band energy Ec than a compound semiconductor material constituting the lower barrier layer BL1 in the joined portion with the lower barrier layer BL1. In this case, the channel layer 7 should have a larger difference in conduction band energy Ec to the lower barrier layer BL1 in the joined portion with the lower barrier layer BL1.

Meanwhile, when the carriers are holes, the energy band on the carrier-running side is a valence band. Thus, the channel layer 7 is constituted using a compound semiconductor material with at least a higher valence band energy Ev than a compound semiconductor material constituting the lower barrier layer BL1 in the joined portion with the lower barrier layer BL1. In this case, the channel layer 7 should have a larger difference in valence band energy Ev to the lower barrier layer BL1 in the joined portion with the lower barrier layer BL1. Although a case where the carriers are electrons is described as an example in the following, the reverse conductivity type should be used instead for describing the impurities and the energy band when the carriers are holes.

In general, the channel layer 7 should lattice-match with the lower barrier layer BL1 favorably and be constituted of a group III-V compound semiconductor material with a narrower band gap than that of a compound semiconductor material constituting the lower barrier layer BL1. The channel layer 7 should have a larger difference in band gap to the lower barrier layer BL1.

The channel layer 7 is, for example, constituted of an InGaAs mixed crystal when the lower barrier layer BL1 is constituted of an $Al_{0.2}Ga_{0.8}As$ mixed crystal. In this case, as the composition ratio of indium (In) is larger, the band gap in the InGaAs mixed crystal difference can be narrower, and the difference in conduction band energy Ec to the lower barrier layer BL1 that is composed of an AlGaAs mixed crystal can be larger. Therefore, the InGaAs mixed crystal constituting the channel layer 7 may have a composition ratio of indium (In) in the III group elements of 0.1 or larger.

The channel layer 7 may be constituted of an In0.2Ga0.8As mixed crystal having an indium (In) composition ratio in the group III elements of 0.2. This enables the channel layer 7 to ensure the lattice matching ability to the lower barrier layer BL1 and obtain a sufficient difference in conduction band energy Ec.

The channel layer 7 may be a u-InGaAs mixed crystal layer that is not doped with any impurities. This enables suppressing the impurity scattering of carriers in the channel layer 7 and achieving carrier movement with high mobility.

The channel layer 7 may be an epitaxially grown layer formed with a film thickness of 15 nm or less. This enables providing a channel layer 7 with secured crystallinity and excellent carrier running ability.

(e) Upper Barrier Layer

The upper barrier layer BL2 lattice-matches with the channel layer 7 favorably.

The upper barrier layer BL2 is constituted using a compound semiconductor having an energy band on the carrier-running side farther away from the intrinsic Fermi level in the channel layer than that of the compound semiconductor constituting the channel layer 7 in the joined portion with the channel layer 7. That is, the upper barrier layer BL2 is constituted using a compound semiconductor having an energy band on the majority carrier-running side farther away from the intrinsic Fermi level in the channel layer than that of the compound semiconductor constituting the channel layer 7 in the joined portion with the channel layer 7. When the carriers are electrons, the upper barrier layer BL2 is constituted using a III-V group compound semiconductor material with higher conduction band energy Ec than a compound semiconductor material constituting the channel layer 7. The upper barrier layer BL2 should have a larger difference in conduction band energy Ec to the channel layer 7 in the joined portion with the channel layer 7.

The upper barrier layer BL2 is, for example, constituted of an AlGaAs mixed crystal with a band gap wider than that of an InGaAs mixed crystal when the channel layer 7 is constituted of an InGaAs mixed crystal. In this case, keeping the composition ratio of aluminum (Al) enables so-called source resistance to be prevented from increasing. Suppressing the diffusion rate of impurities during forming the gate diffusion layer 16 can ensure controllability. From this viewpoint, an AlGaAs mixed crystal constituting the upper barrier layer BL2 may have a composition ratio of aluminum (Al) in the group III elements of 0.25 or lower.

The upper barrier layer BL2 has a carrier supply layer 9 doped with impurities that supply carriers. For example, the N-type carrier supply layer 9 doped with silicon (Si) as an N-type impurity that supplies electrons with a thickness of about 4 nm is provided in an intermediate portion in the film thickness direction of the upper barrier layer BL2.

Regions sandwiching the carrier supply layer 9 in the film thickness direction in the upper barrier layer BL2 constitute the high resistance layers 8 and 10. The high resistance layers 8 and 10 are not doped with any impurities or are doped with low concentration impurities. When the high resistance layers 8 and 10 are doped with impurities, the high resistance layer 8 on the channel layer 7 side is doped with an N-type impurity or a P-type impurity. In contrast, a high resistance layer 10 on the opposite side to the channel layer 7, that is, the surface side of the upper barrier layer BL2 is doped with an N-type impurity. The high resistance layers 8 and 10 preferably have impurity concentrations of $1\times10^{17}$ numbers/$cm^3$ or lower and resistivities of $1\times10^{-2}$ Ωcm or larger.

The gate diffusion layer 16 and the P-Wing layer 11 are provided on the surface side of the upper barrier layer BL2. The gate diffusion layer 16 and the P-Wing layer 11 are provided on the opposite side to the channel layer 7 in the upper barrier layer BL2. The gate diffusion layer 16 is provided between the source electrode 14 and the drain electrode 18 in the horizontal direction (for example, the left-right direction in FIG. 3) orthogonal to the film thickness direction. The P-Wing layers 11 are provided in portions between the gate diffusion layer 16 and the source electrode 14 and between the gate diffusion layer 16 and the drain electrode 18.

One example of a specific structure of the upper barrier layer BL2 is as follows. The upper barrier layer BL2 includes a high resistance layer 8, a carrier supply layer 9, and a high resistance layer 10. The lower-side portion of the gate diffusion layer 16 and an ohmic metal layers 13 are provided in the high resistance layer 10.

The high resistance layer 8 having a film thickness of about 2 nm and not doped with impurities is provided on the channel layer 7 side. Above the high resistance layer 8, the carrier supply layer 9 having a film thickness of 4 nm and doped with about $1.6 \times 10^{12}$ numbers/cm2 of silicon (Si) is stacked. Further above this carrier supply layer 9, the high resistance layer 10 having a film thickness of about 100 nm and not doped with any impurities is stacked. On the upper part of the high resistance layer 10, the P-Wing layer 11 with a film thickness of about 30 nm and the cap layer 12 are stacked in this order. Then, the gate diffusion layer 16 is provided at a depth extending from the surface of the cap layer 12 through the P-Wing layer 11 to reach the high resistance layer 10.

When the channel layer 7 is constituted of an InGaAs mixed crystal, the upper barrier layer BL2 is not limited to one constituted of an AlGaAs mixed crystal and may be constituted of an In(AlGa)AsP mixed crystal, a III-V group compound semiconductor. This enables heightening the In composition ratio in the channel layer 7 constituted of an InGaAs mixed crystal and increasing the carrier mobility in the channel layer 7.

(e1) Gate Diffusion Layer

The gate diffusion layer 16 is provided on the side closer to the surface than the carrier supply layer 9 in the upper barrier layer BL2. The gate diffusion layer 16 is provided with an interval to the carrier supply layer 9. The gate diffusion layer 16 is doped with a reverse conductivity type impurity to the carrier running in the channel layer 7 and is formed to have a lower resistance than the surrounding high resistance layer 10. When the carriers are electrons, a P-type impurity is diffused in the gate diffusion layer 16.

The values of the thickness (depth) and the P-type impurity concentration of the gate diffusion layer 16 depend on the threshold voltage of a transistor. The threshold voltage increases when the gate diffusion layer 16 is made thicker, or the P-type impurity concentration is made higher. On the contrary, the threshold voltage decreases when the gate diffusion layer 16 is made thinner, or the P-type impurity concentration is made lower.

The gate diffusion layer 16 may contain $1 \times 10^{18}$ numbers/cm$^3$ or more of P-type impurities, and as an example, contains about $1 \times 10^{19}$ numbers/cm$^3$ of P-type impurities. Carbon (C), zinc (Zn), or magnesium (Mg) is used as the P-type impurity in the upper barrier layer BL2 constituted by an In(AlGa)AsP mixed crystal. These impurities are appropriately selected and used depending on the forming method of the gate diffusion layer 16.

(f) Electric-Field Relaxation Layer

The compound semiconductor device 1 includes the first electric-field relaxation layer ER1 and the second electric-field relaxation layer ER2 for increasing the pressure resistance of a transistor. The first electric-field relaxation layer ER1 and the second electric-field relaxation layer ER2 each have the P-Wing layer 11 and the cap layer 12. Note that, in the present description, the upper barrier layer BL2 is separately described from the first electric-field relaxation layer ER1 and the second electric-field relaxation layer ER2, but it may be understood that the first electric-field relaxation layer ER1 and the second electric-field relaxation layer ER2 are included in the upper barrier layer BL2.

(f1) P-Wing Layer

The P-Wing layer 11 is provided on the high resistance layer 10. P-Wing layer 11 is constituted of the same semiconductor material as the high resistance layer 10.

For example, when the high resistance layer 10 is constituted of an AlGaAs mixed crystal, the P-Wing layer 11 is constituted of the AlGaAs mixed crystal. The P-Wing layer 11 may be constituted of a semiconductor material different from that of the high resistance layer 10 as long as it is a compound semiconductor lattice-matching with the high resistance layer 10 favorably. The P-Wing layer 11 is provided with an interval to the carrier supply layer 9 by the thickness of the high resistance layer 10. The distance between the carrier supply layer 9 and the P-Wing layer 11 is larger than the distance between the carrier supply layer 9 and the gate diffusion layer 16. The P-Wing layer 11 is extended from the gate diffusion layer 16 toward both the source electrode 14 side and the drain electrode 18 side.

The P-Wing layer 11 is a P-type region doped with a reverse conductivity type impurity to the carriers running in the channel layer 7. The P-Wing layer 11 has a lower quantity of P-type electric charge within the entire region than the gate diffusion layer 16. The quantity of P-type electric charge in the P-Wing layer 11 is such that the holes in the P-Wing layer 11 are depleted during the off operation when a negative voltage is applied to the gate electrode 17. Furthermore, the quantity of P-type electric charge per unit length (per unit horizontal length in the drawings) in the P-Wing layer 11 is preferably smaller than that in the gate diffusion layer 16. This enables the quantity of P-type electric charge in the P-Wing layer 11 to be further decreased compared to the gate diffusion layer 16 even when the horizontal length of the P-Wing layer 11 is extremely wide.

The P-Wing layer 11 is formed such that the film thickness thereof is thinner than that of the gate diffusion layer 16, that is, thinner than that of the gate diffusion layer 16. This keeps the quantity of P-type electric charge in the P-Wing layer 11 smaller than that of the gate diffusion layer 16. In this case, for example, the P-Wing layer 11 may contain about $1 \times 10^{18}$ numbers/cm$^3$ of P-type impurities, and as one example, about $1 \times 10^{18}$ numbers/cm$^3$. The P-Wing layer 11 may be formed so as to have a P-type impurity concentration lower than that in the gate diffusion layer 16 and to be in a depth of the same degree as that of the gate diffusion layer 16, that is, to have a film thickness of the same degree as that of the gate diffusion layer 16. At least one or more of carbon (C), zinc (Zn), and magnesium (Mg) are used as a P-type impurity doped in the P-Wing layer 11. These impurities are appropriately selected and used, as appropriate, depending on the forming method of the P-Wing layer 11.

(f2) Cap Layer

The cap layer 12 is formed in a form stacked on the P-Wing layer 11. The cap layer 12 may have a thin film thickness. The cap layer 12 is constituted of the same semiconductor material as the P-Wing layer 11. The cap layer 12 may be constituted of a different semiconductor material from that of the P-Wing layer 11 as long as it is a compound semiconductor lattice-matching with the P-Wing layer 11 favorably. The cap layer 12 may be or may not be doped with impurities, and if doped, the cap layer 12 may be doped with either a P-type impurity or an N-type impurity. For example, the cap layer 12 is constituted of an AlGaAs having a thickness of 50 nm and not doped with any impurities. The cap layer 12 may be constituted of GaAs having a thickness of 40 nm and doped with Si as an N-type impurity.

(g) Amorphous Layer

The first amorphous layer AM1 is provided between the gate diffusion layer 16 and the drain electrode 18. The second amorphous layer AM2 is provided between the gate diffusion layer 16 and the source electrode 14. The first amorphous layer AM1 and the second amorphous layer AM2 are each obtained by ion-implanting an impurity such as boron using a resist pattern as a mask to partially break the crystal structure of the layered film including the cap layer 12 and the P-Wing layer 11 to amorphize. Boron or the like can be mentioned as examples of the impurities for ion implantation.

(h) Interlayer Insulation film

The first interlayer insulation film 15 and the second interlayer insulation film 20 are provided in a state of covering the entire surface of the upper barrier layer BL2 and the cap layer 12. The first interlayer insulation film 15 and the second interlayer insulation film 20 have insulating properties with respect to the compound semiconductors constituting the upper barrier layer BL2 and the cap layer 12. The first interlayer insulation film 15 and the second interlayer insulation film 20 are each constituted of silicon nitride ($Si_3N_4$). The thickness of the layered film including the first interlayer insulation film 15 and the second interlayer insulation film 20 is, for example, 200 nm. A source opening and a drain opening are provided in the first interlayer insulation film 15 and the second interlayer insulation film 20. A gate opening for exposing the surface of the gate diffusion layer 16 is provided between the source opening and the drain opening in the first interlayer insulation film 15 and the second interlayer insulation film 20. The source opening, the drain opening, and the gate opening are independent openings provided apart from one another.

(i) Source Electrode, Drain Electrode

The source electrode 14 and the drain electrode 18 is ohmically joined to the ohmic metal layer 13 provided in the high resistance layer 10 of the upper barrier layer BL2 via the source opening and the drain opening. The ohmic metal layer 13 is formed by sequentially stacking gold (Au)-germanium (Ge), nickel (Ni), and gold (Au) in this order from the high resistance layer 10 side and alloying the stacked metal films with the base high resistance layer 10. The source electrode 14 and the drain electrode 18 are constituted of the upper layer gold (Au) out of the stacked metal films. The respective film thicknesses of the source electrode 14 and the drain electrode 18 are, for example, 1000 nm.

(j) Gate Electrode

The gate electrode 17 is provided at the upper part of the gate diffusion layer 16. The gate electrode 17 is provided in a state of filling the gate opening and is connected to the gate diffusion layer 16 at the bottom of the gate opening. The gate electrode 17 is constituted of a film in which Nickel (Ni) and gold (Au) are stacked sequentially from the substrate 2 side.

(Method of Manufacturing Compound Semiconductor Device)

A method of manufacturing the compound semiconductor device 1 according to the first embodiment of the present disclosure will be described next. The compound semiconductor device 1 is manufactured using various types of devices such as a film deposition device (including epitaxial growth devices, chemical vapor deposition (CVD) devices, thermal oxidation furnaces, sputtering devices, and resist application devices), exposure devices, ion implantation devices, annealing devices, etching devices, and chemical mechanical polishing (CMP) devices. Hereinafter, these devices are collectively referred to as a manufacturing apparatus.

Figure 4A:
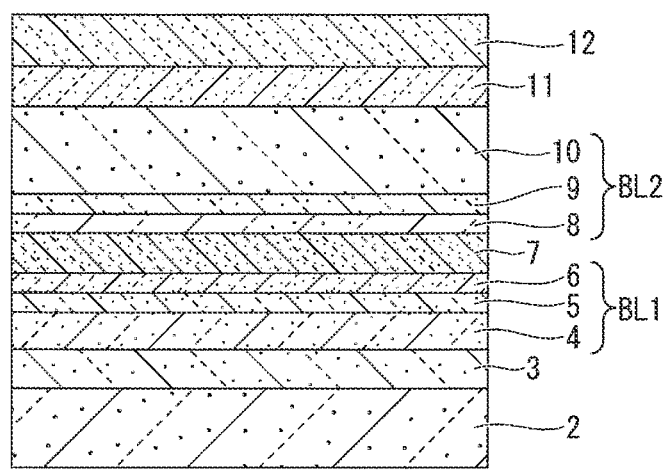
FIG. 4A is a cross-sectional view illustrating a method of manufacturing the compound semiconductor device 1 according to the first embodiment of the present disclosure along the order of steps.

FIGS. 4A, 4B, 4C, 4D, 4E, 4F, 4G, 4H, 4I, and 4J are cross-sectional views illustrating a method of manufacturing the compound semiconductor device 1 according to the first embodiment of the present disclosure along the order of steps. In FIG. 4A, the manufacturing apparatus epitaxially grows a u-GaAs layer, an undoped GaAs layer that is not doped with impurities, on a substrate 2 made of GaAs to form the buffer layer 3.

Next, the manufacturing apparatus epitaxially grows, for example, an AlGaAs (Al0.2Ga0.8As mixed crystal) layer on the buffer layer 3 to form the lower barrier layer BL1. At this time, the production device, for example, epitaxially grows the high resistance layer 4 made of a u-AlGaAs layer not doped with any impurities, the carrier supply layer 5 made of an N-type AlGaAs layer doped with silicon (Si), and the high resistance layer 6 made of a u-AlGaAs layer not doped with any impurities. This provides the lower barrier layer BL1 provided with an N-type carrier supply layer 5 at the center in the film thickness direction.

Next, the manufacturing apparatus forms a channel layer 7 by epitaxially growing, for example, a u-InGaAs layer not doped with any impurities on the lower barrier layer BL1.

Next, the manufacturing apparatus epitaxially grows, for example, an AlGaAs ($Al_{0.2}Ga_{0.8}As$ mixed crystal) layer on the channel layer 7 to form the upper barrier layer BL2. At this time, the manufacturing apparatus epitaxially grows the high resistance layer 8 made of a u-AlGaAs layer not doped with any impurities, the carrier supply layer 9 made of an N-type AlGaAs layer doped with silicon (Si), the high resistance layer 10 made of an N-type AlGaAs layer doped with silicon (Si), a low resistance layer 11 made of a P-type AlGaAs layer doped with carbon (C), and the cap layer 12 made of a u-AlGaAs layer not doped with any impurities.

Figure 4B:
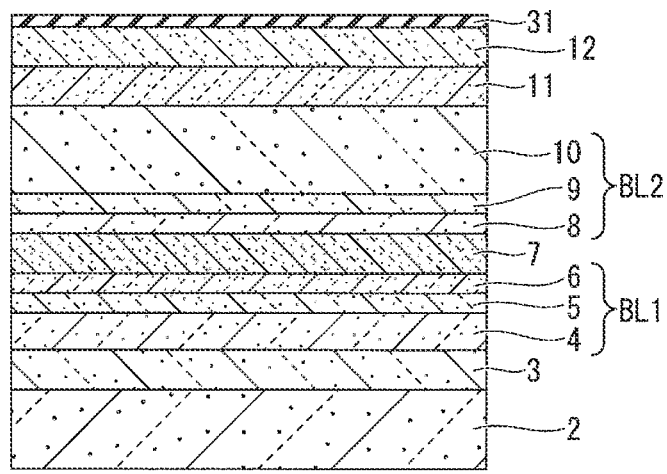
FIG. 4B is a cross-sectional view illustrating the method of manufacturing the compound semiconductor device 1 according to the first embodiment of the present disclosure along the order of steps.
Figure 4C:
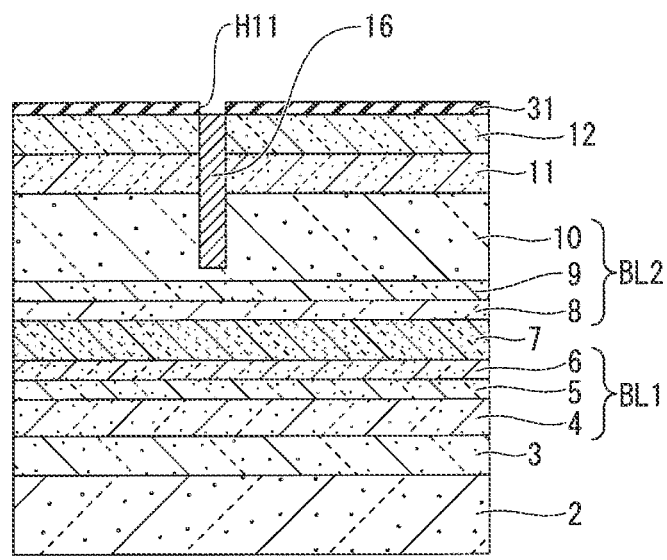
FIG. 4C is a cross-sectional view illustrating the method of manufacturing the compound semiconductor device 1 according to the first embodiment of the present disclosure along the order of steps.

Next, as illustrated in FIG. 4B, the manufacturing apparatus forms an insulation film 31 made of silicon nitride ($Si_3N_4$) on the cap layer 12 by, for example, a chemical vapor deposition (CVD) method. Next, as illustrated in FIG. 4C, the manufacturing apparatus forms an opening H11 for exposing the cap layer 12 by partially etching the insulation film 31. Next, the manufacturing apparatus introduces P-type impurities into the cap layer 12, the low resistance layer 11, and the high resistance layer 10 using, as a mask, the insulation film 31 with the opening H11. The manufacturing apparatus forms a gate diffusion layer 16 in the upper barrier layer BL2 in this way. In this step, the manufacturing apparatus diffuses zinc (Zn), a P-type impurity, in a depth exceeding the depth of the low resistance layer 11 and not reaching the carrier supply layer 9 to form the gate diffusion layer 16. Zinc (Zn) is diffused by gas phase diffusion using a zinc compound gas at a temperature of, for example, about 600° C. The gate diffusion layer 16 is formed by self-alignment at the bottom part of the opening H11, and a state where the low resistance layers 11 are extended on both sides of the gate diffusion layer 16 is formed.

Figure 4D:
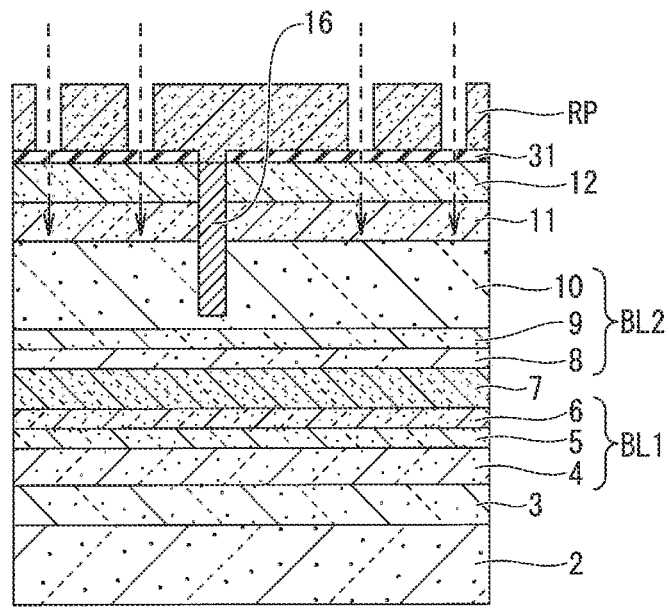
FIG. 4D is a cross-sectional view illustrating the method of manufacturing the compound semiconductor device 1 according to the first embodiment of the present disclosure along the order of steps.

Next, as illustrated in FIG. 4D, the manufacturing apparatus forms a resist pattern RP on the upper barrier layer BL2 and the cap layer 12 on which the gate diffusion layer 16 is formed. The resist pattern RP has a shape opened above the region where the first amorphous layer AM1 and the second amorphous layer AM2 (see FIG. 3) are formed and covering the other areas.

Figure 4E:
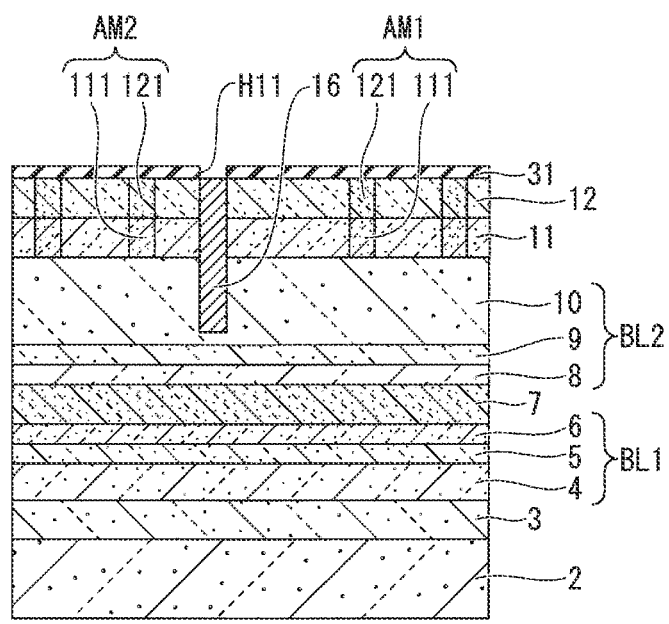
FIG. 4E is a cross-sectional view illustrating the method of manufacturing the compound semiconductor device 1 according to the first embodiment of the present disclosure along the order of steps.

Next, the manufacturing apparatus ion-implants the impurity (for example, boron) into the cap layer 12 and the low resistance layer 11 through the insulation film 31 using the resist pattern RP as a mask. In this way, as illustrated in FIG. 4E, the manufacturing apparatus partially amorphizes the cap layer 12 and the low resistance layer 11 to form the first amorphous layer AM1 and the second amorphous layer AM2. The impurity to be ion-implanted is preferably an inactive impurity that does not show conductivity in the low resistance layer 11 and the cap layer 12, such as boron. This enables preventing the fluctuation of the acceptor concentration or the donor concentration due to amorphization.

The depth of the ion implantation is preferably made to a depth enough to amorphize the low resistance layer 11 and not to allow boron to reach the channel layer 7. This enables preventing ions from reaching the channel layer 7, and therefore, the deterioration of element characteristics such as the fluctuation in on-resistance due to amorphization can be prevented.

As illustrated in FIG. 1, the first amorphous layer AM1 and the second amorphous layer AM2 are each formed in islands shapes. After that, the manufacturing apparatus removes the resist pattern RP, as illustrated in FIG. 4E.

Figure 4F:
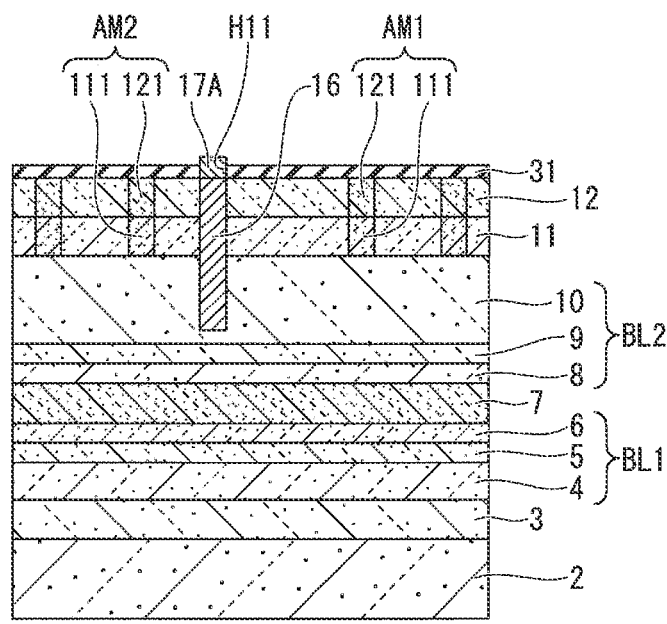
FIG. 4F is a cross-sectional view illustrating the method of manufacturing the compound semiconductor device 1 according to the first embodiment of the present disclosure along the order of steps.

Next, as illustrated in FIG. 4F, the manufacturing apparatus forms a lower part 17A of the gate electrode 17 on the gate diffusion layer 16. The lower part 17A has a shape for filling the opening H11. At this time, the manufacturing apparatus mask-deposits titanium (Ti), platinum (Pt), and gold (Au) sequentially to pattern the lower part 17A of the gate electrode. After forming the lower part 17A, the manufacturing apparatus removes the insulation film 31.

Figure 4G:
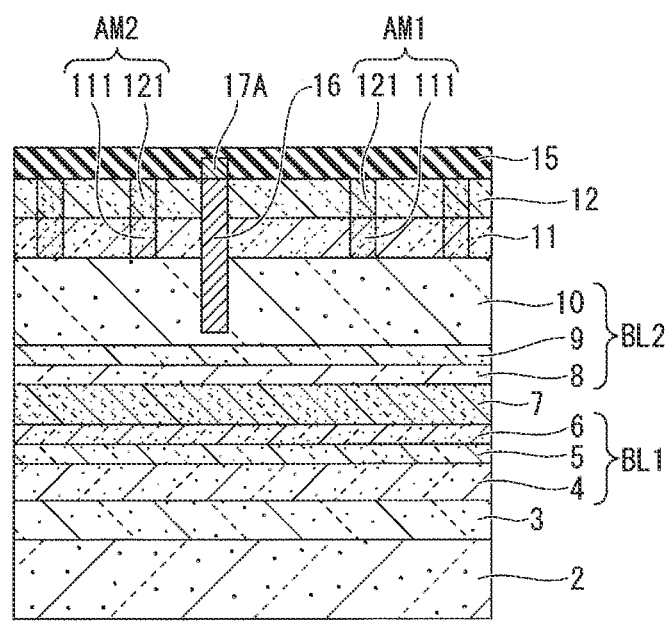
FIG. 4G is a cross-sectional view illustrating the method of manufacturing the compound semiconductor device 1 according to the first embodiment of the present disclosure along the order of steps.
Figure 4H:
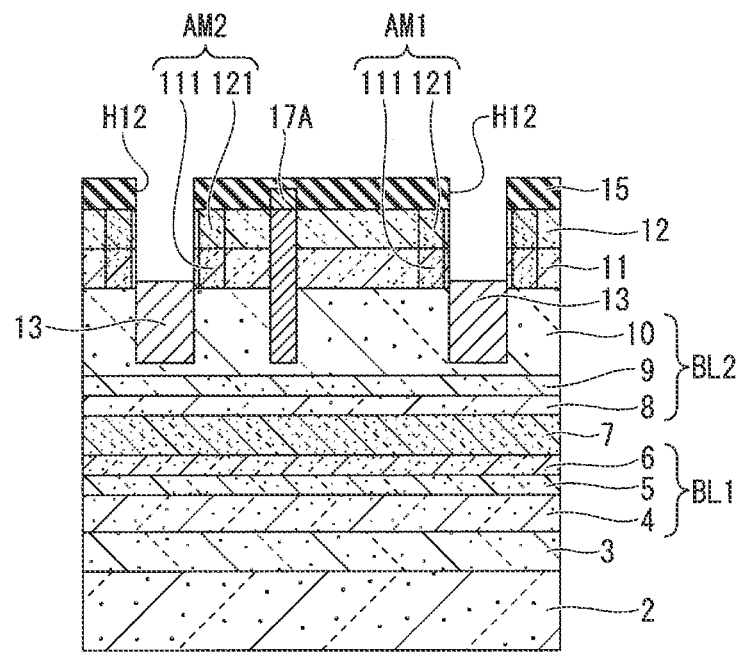
FIG. 4H is a cross-sectional view illustrating the method of manufacturing the compound semiconductor device 1 according to the first embodiment of the present disclosure along the order of steps.

Next, as illustrated in FIG. 4G, the manufacturing apparatus forms a first interlayer insulation film 15 made of silicon nitride ($Si_3N_4$) on the cap layer 12 by, for example, a CVD method. The lower part 17A of the gate electrode is covered with the first interlayer insulation film 15. Next, as illustrated in FIG. 4H, the manufacturing apparatus forms an opening H12 for exposing the high resistance layer 10 by partially etching the first interlayer insulation film 15, the cap layer 12, and the low resistance layer 11. The manufacturing apparatus forms an opening H12 between the first amorphous layer AM1 and the second amorphous layer AM2, which are adjacent to each other. The low resistance layer (P-Wing layer) 11 has a shape illustrated in FIGS. 1 and 3 after the opening H12 is formed.

Next, the manufacturing apparatus forms an ohmic metal layer 13 in the high resistance layer 10 exposed at the bottom part of the opening H12. At this time, the manufacturing apparatus deposits gold-germanium (AuGe) and nickel (Ni) sequentially and patterns them, and performs a heating treatment at, for example, 400° C. to form an ohmic metal layer 13.

Figure 4I:
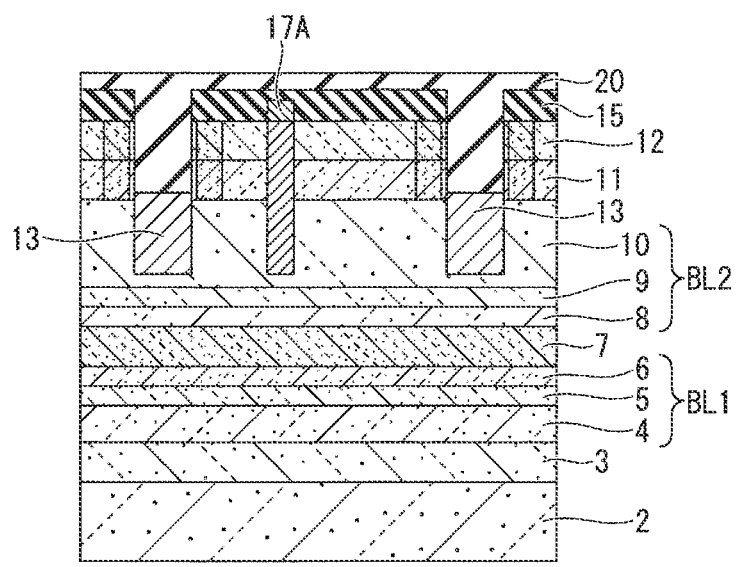
FIG. 4I is a cross-sectional view illustrating the method of manufacturing the compound semiconductor device 1 according to the first embodiment of the present disclosure along the order of steps.

Next, as illustrated in FIG. 4I, the manufacturing apparatus forms a second interlayer insulation film 20 made of silicon nitride ($Si_3N_4$) on the first interlayer insulation film 15 by, for example, a CVD method. The opening H12 provided in the first interlayer insulation film 15 is filled with the second interlayer insulation film 20. Next, the manufacturing apparatus flattens the upper surface of the second interlayer insulation film 20 by, for example, a CMP method.

Next, the manufacturing apparatus partially etches the second interlayer insulation film 20 to form the source opening and the drain opening on the ohmic metal layer 13 and form gate opening on the lower part 17A of the gate electrode. The ohmic metal layer 13 is exposed at each bottom of the source opening and the drain opening. The lower part 17A of the gate electrode is exposed at the bottom of the gate opening.

Figure 4J:
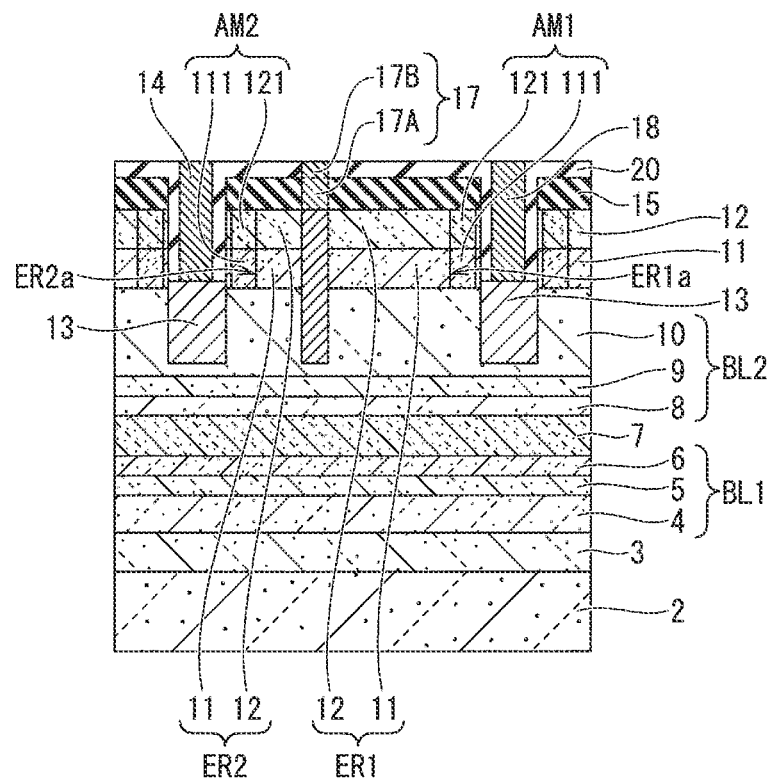
FIG. 4J is a cross-sectional view illustrating the method of manufacturing the compound semiconductor device 1 according to the first embodiment of the present disclosure along the order of steps.

Next, the manufacturing apparatus deposits and patterns, for example, gold (Au). In this way, as illustrated in FIG. 4J, the manufacturing apparatus forms the source electrode 14 in the source opening, the drain electrode 18 in the drain opening, and the upper part 17B of the gate electrode in the gate opening. After that, the manufacturing apparatus forms gate wirings GL, a third interlayer insulation film 24, source wirings SL, and drain wirings DL. The compound semiconductor device 1 illustrated in FIGS. 1 to 3 is completed through the above steps.

(Effects of Embodiments)

As described above, the compound semiconductor device 1 according to the first embodiment of the present disclosure includes a laminated body constituted of a compound semiconductor and including a channel layer 7 in which N-type carriers (that is, electrons) run; a source electrode 14 provided on an upper surface side of the laminated body; a gate electrode 17 provided on the upper surface side of the laminated body; and a drain electrode 18 provided on the upper surface side of the laminated body. The laminated body includes a P-type gate diffusion layer 16 that is provided at a position facing the gate electrode 17 and is in contact with the gate electrode 17, a first electric-field relaxation layer ER1 extended from the gate diffusion layer 16 toward the drain electrode 18 side and configured to relax the electric field concentration to the gate diffusion layer 16, and a first amorphous layer AM1 covering a first side surface ER1a that is a side surface of the first electric-field relaxation layer ER1 and faces one of the drain electrodes 18.

This enables the first amorphous layer AM1 to prevent hydrogen ions and the like with kinetic energy, which are generated due to the process, from being implanted into the inside of the first electric-field relaxation layer ER1 from the first side surface ER1a of the first electric-field relaxation layer ER1 even when hydrogen ions are generated due to the process during forming the drain opening. The first amorphous layer AM1 can suppress the inactivation of the impurities (for example, carbon or the like) in the first electric-field relaxation layer ER1 by the above hydrogen ions or the like. This enables the compound semiconductor device 1 to stabilize the activation ratio of impurities in the first electric-field relaxation layer ER1 and relax the electric field concentration to the gate diffusion layer 16 with high reliability. This enables the compound semiconductor device 1 to suppress the deterioration of element characteristics (such as a pressure resistance reduction due to the electric field concentration to the gate diffusion layer 16).

The laminated body further includes a second electric-field relaxation layer ER2 extended from the gate diffusion layer 16 toward the source electrode 14 side and configured to relax the electric field concentration to the gate diffusion layer 16 and a second amorphous layer AM2 covering a second side surface ER2a that is a side surface of the second electric-field relaxation layer ER2 and faces the source electrode 14.

This can have the second amorphous layer AM2 prevent generated hydrogen ions or the like from being implanted into the inside of the second electric-field relaxation layer ER2 from the second side surface ER2a of the second electric-field relaxation layer ER2 even when hydrogen ions are generated due to the process during forming a source opening and prevent carbon or the like in the second electric-field relaxation layer ER2 from being inactivated by the above hydrogen ions or the like. This enables the compound semiconductor device 1 to stabilize the activation ratio of impurities in the second electric-field relaxation layer ER2 and relax the electric field concentration to the gate diffusion layer 16 with high reliability. This enables the compound semiconductor device 1 to further suppress the deterioration of element characteristics.

For example, the first electric-field relaxation layer ER1 and the second electric-field relaxation layer ER2 each have the P-Wing layer 11 and the cap layer 12 provided on the P-Wing layer 11. The P-Wing layer 11 is provided in contact with the gate diffusion layer 16 and has a lower P-type impurity concentration than the gate diffusion layer 16. The cap layer 12 is provided in contact with the gate diffusion layer 16 and has a higher electric resistance than the P-Wing layer 11. In this way, the electric field concentration to the gate diffusion layer 16 is relaxed in the P-Wing layer 11 because the depletion layer spreads from the P-Wing layer 11 toward the N-type high resistance layer 10 side, and the depletion layer is likely to spread between the gate diffusion layer 16 and the channel layer 7.

Furthermore, the first amorphous layer AM1 (or the second amorphous layer AM2) and the cap layer 12 form a structure wherein the P-Wing layer 11, which constitutes the main body of the electric-field relaxation layer, is not directly exposed. This prevents hydrogen ions generated due to the process from being implanted into the P-Wing layer 11 and stabilizes the activation rate of carbon or the like as an impurity. This effect enables enhancing the reliability of the element (HEMT) and lowering the production cost due to high yield.

The method of manufacturing a compound semiconductor device according to the first embodiment of the present disclosure includes a step of forming a laminated body constituted of a compound semiconductor and including a channel layer 7 in which electrons run; a step of forming a gate electrode 17 on an upper surface side of the laminated body; a step of forming a source electrode 14 provided on the upper surface side of the laminated body; and a step of forming a drain electrode 18 provided on the upper surface side of the laminated body. The step of forming a laminated body includes a step of forming a P-type gate diffusion layer 16 that is placed at a position facing the gate electrode 17 and is in contact with the gate electrode 17; a step of forming a first electric-field relaxation layer ER1 extended from the gate diffusion layer 16 toward the drain electrode 18 side and configured to relax the electric field concentration to the gate diffusion layer 16; and a step of forming a first amorphous layer AM1 so as to cover a first side surface ER1*a* that is a side surface of the first electric-field relaxation layer ER1 and faces the drain electrode 18. In the step of forming a first amorphous layer AM1, the first amorphous layer AM1 is formed by partially ion-implanting an impurity into the first electric-field relaxation layer ER1 to amorphize.

This enables the manufacture of a compound semiconductor device 1 with a stable activation rate of impurities in the first electric-field relaxation layer ER1 and less-deteriorated element characteristics.

Modification Example 1

In the first embodiment, a procedure including forming a gate electrode, then forming a first amorphous layer and a second amorphous layer, and thereafter forming an ohmic metal layer, a source electrode, and a drain electrode are explained for illustrating the order of steps in a method of manufacturing a compound semiconductor device 1. However, the method of manufacturing a compound semiconductor device 1 is not limited thereto in embodiments of the present disclosure. In an embodiment of the present disclosure, the cap layer 12 and the low resistance layer (P-Wing layer) 11 are amorphized by ion implantation after the cap layer 12 is formed. Other steps may be performed in any order.

For example, the method of manufacturing a compound semiconductor device 1 may be performed in the order of the steps of first forming a first amorphous layer and a second amorphous layer, then forming a gate electrode, and thereafter forming an ohmic metal layer, a source electrode, and a drain electrode. In the steps of forming a first amorphous layer AM1 and a second amorphous layer AM2, impurities may be directly implanted into the cap layer 12 and the low resistance layer 11 without passing through an insulating layer. The compound semiconductor device 1 can be manufactured even in such an order of steps.

Figure 5A:
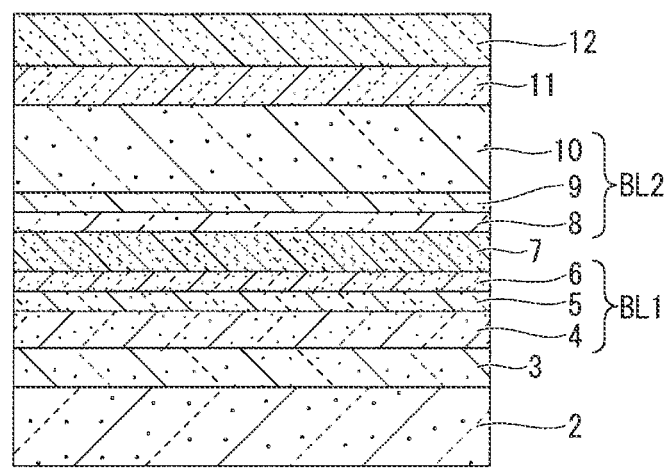
FIG. 5A is a cross-sectional view illustrating a method of manufacturing the compound semiconductor device 1 according to an embodiment (Modification Example 1) of the present disclosure along the order of steps.
Figure 5B:
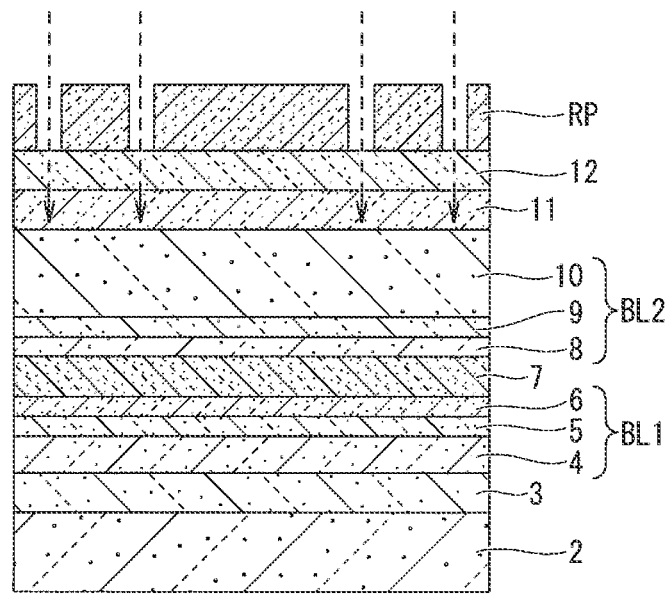
FIG. 5B is a cross-sectional view illustrating the method of manufacturing the compound semiconductor device 1 according to the embodiment (Modification Example 1) of the present disclosure along the order of steps.

FIGS. 5A, 5B, 5C, 5D, 5E, and 5F are cross-sectional views illustrating a manufacturing method (Modification Example 1) of the compound semiconductor device 1 according to an embodiment of the present disclosure along the order of steps. In FIG. 5A, the steps up to forming the cap layer 12 are the same as those in the above manufacturing method with reference to FIG. 4A. In Modification Example 1, after forming the cap layer 12, the manufacturing apparatus forms a resist pattern RP on the cap layer 12, as illustrated in FIG. 5B. The resist pattern RP has a shape opened being above the region where the first amorphous layer AM1 and the second amorphous layer AM2 (see FIG. 3) are formed and covering the other areas. Next, the manufacturing apparatus ion-implants the impurity (for example, boron) into the cap layer 12 and the low resistance layer (P-Wing layer) 11 using the resist pattern RP as a mask.

Figure 5C:
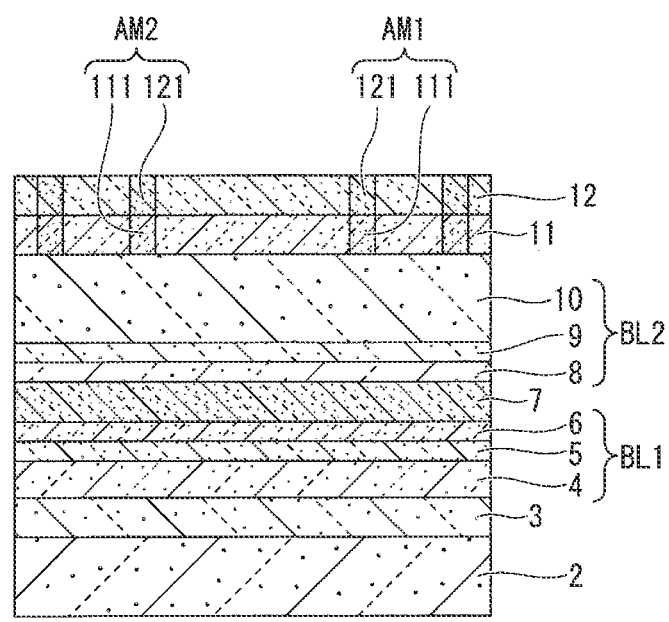
FIG. 5C is a cross-sectional view illustrating the method of manufacturing the compound semiconductor device 1 according to the embodiment (Modification Example 1) of the present disclosure along the order of steps.
Figure 5D:
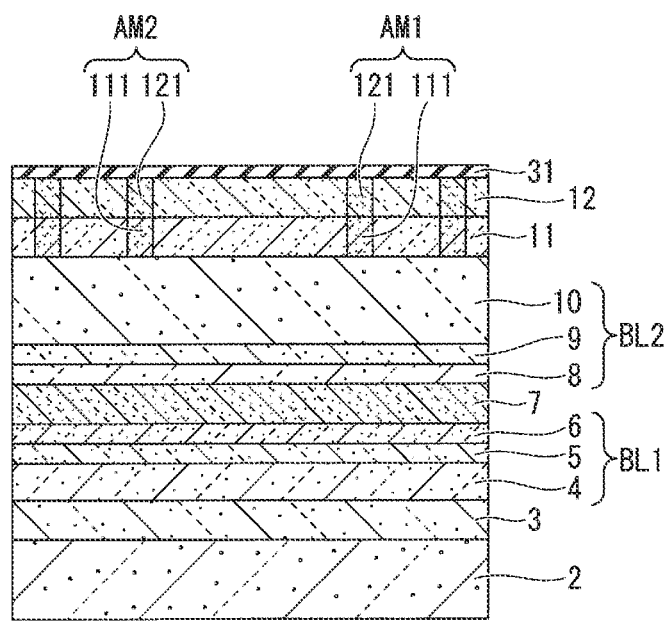
FIG. 5D is a cross-sectional view illustrating the method of manufacturing the compound semiconductor device 1 according to the embodiment (Modification Example 1) of the present disclosure along the order of steps.
Figure 5E:
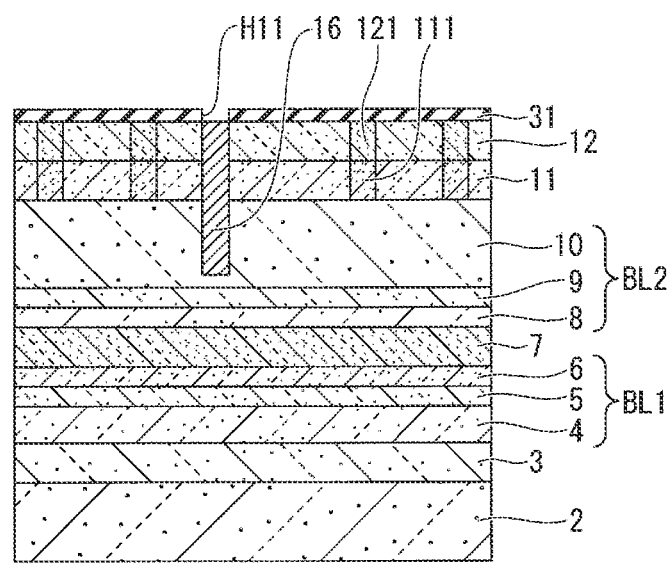
FIG. 5E is a cross-sectional view illustrating the method of manufacturing the compound semiconductor device 1 according to the embodiment (Modification Example 1) of the present disclosure along the order of steps.

In this way, as illustrated in FIG. 5C, the manufacturing apparatus partially amorphizes the cap layer 12 and the low resistance layer 11 to form the first amorphous layer AM1 and the second amorphous layer AM2. Next, as illustrated in FIG. 5D, the manufacturing apparatus forms the insulation film 31 on the cap layer 12. Next, as illustrated in FIG. 5E, the manufacturing apparatus forms an opening H11 for exposing the cap layer 12 by partially etching the insulation film 31. Next, the manufacturing apparatus introduces P-type impurities into the cap layer 12, the low resistance layer 11, and the high resistance layer 10 using, as a mask, the insulation film 31 in which the opening H11 is formed. The manufacturing apparatus forms a gate diffusion layer 16 in the upper barrier layer BL2 in this way.

Figure 5F:
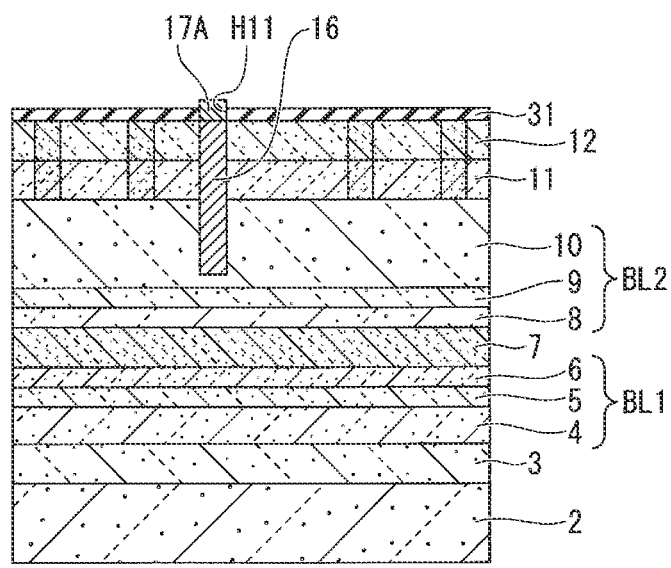
FIG. 5F is a cross-sectional view illustrating the method of manufacturing the compound semiconductor device 1 according to the embodiment (Modification Example 1) of the present disclosure along the order of steps.

Next, as illustrated in FIG. 5F, the manufacturing apparatus forms a lower part 17A of the gate electrode 17 on the gate diffusion layer 16. The lower part 17A has a shape for filling the opening H11. After forming the lower part 17A, the manufacturing apparatus removes the insulation film 31.

Subsequent steps are the same as those of the manufacturing method described earlier with reference to FIGS. 4G, 4H, 4I, and 4J. That is, as illustrated in FIG. 4G, the manufacturing device forms the first interlayer insulation film 15. Next, as illustrated in FIG. 4H, the manufacturing apparatus forms an opening H12 for exposing the high resistance layer 10 by partially etching the first interlayer insulation film 15, the cap layer 12, and the low resistance layer 11. Next, as illustrated in FIG. 4I, the manufacturing apparatus forms a second interlayer insulation film 20. In this way, as illustrated in FIG. 4J, the manufacturing apparatus forms source, drain, and gate openings, then forms a source electrode 14 in the source opening, a drain electrode 18 in the drain opening, and the upper part 17B of a gate electrode in the gate opening. After that, the manufacturing apparatus forms gate wirings GL, a third interlayer insulation film 24, source wirings SL, and drain wirings DL. The compound semiconductor device 1 illustrated in FIGS. 1 to 3 is completed through the above steps.

Modification Example 2

In an embodiment, the steps in a method of manufacturing a compound semiconductor device 1 may be performed in the following order: forming a gate electrode, then forming an ohmic metal layer, then forming a first amorphous layer and a second amorphous layer, and thereafter forming a source electrode and a drain electrode. In the steps of forming the first amorphous layer AM1 and the second amorphous layer AM2, impurities may be directly implanted into the cap layer 12 and the low resistance layer 11 without passing through an interlayer insulation film. The compound semiconductor device 1 can be manufactured even in such an order of steps.

Figure 6A:
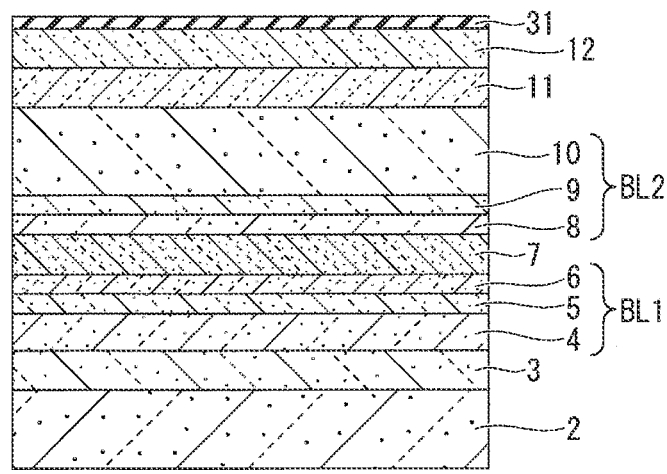
FIG. 6A is a cross-sectional view illustrating a method of manufacturing the compound semiconductor device 1 according to an embodiment (Modification Example 2) of the present disclosure along the order of steps.
Figure 6B:
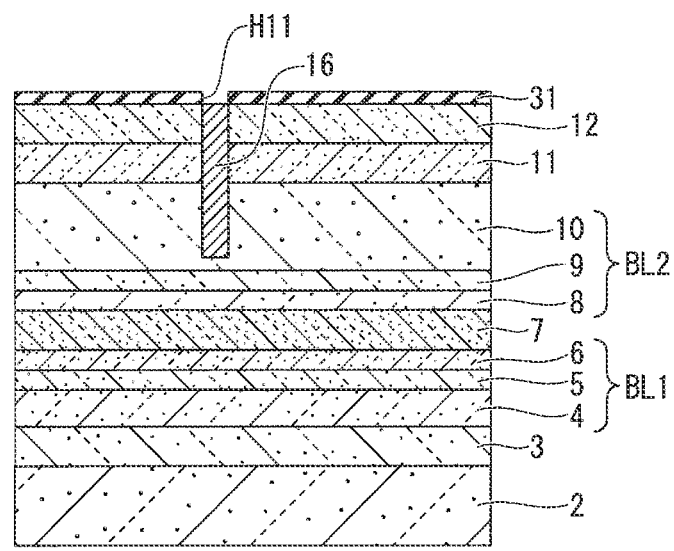
FIG. 6B is a cross-sectional view illustrating the method of manufacturing the compound semiconductor device 1 according to the embodiment (Modification Example 2) of the present disclosure along the order of steps.
Figure 6C:
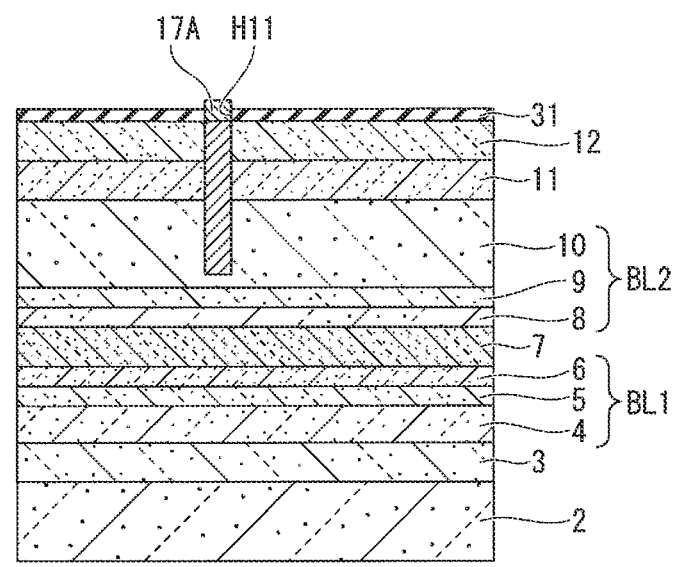
FIG. 6C is a cross-sectional view illustrating the method of manufacturing the compound semiconductor device 1 according to the embodiment (Modification Example 2) of the present disclosure along the order of steps.

FIGS. 6A, 6B, 6C, 6D, 6E, 6F, 6G, and 6H are cross-sectional views illustrating a method of manufacturing the compound semiconductor device 1 according to an embodiment (Modification Example 2) of the present disclosure along the order of steps. The steps up to forming an insulation film 31, as illustrated in FIG. 6A, and forming an opening H11 and then forming gate diffusion layer 16, as illustrated in FIG. 6B, are the same as those in the above manufacturing method with reference to FIGS. 4A, 4B, and 4C. In Modification Example 2, after forming the opening H11, the manufacturing apparatus forms a lower part 17A of the gate electrode 17 on the gate diffusion layer 16, as illustrated in FIG. 6C. The lower part 17A has a shape for filling the opening H11. After forming the lower part 17A, the manufacturing apparatus removes the insulation film 31.

Figure 6D:
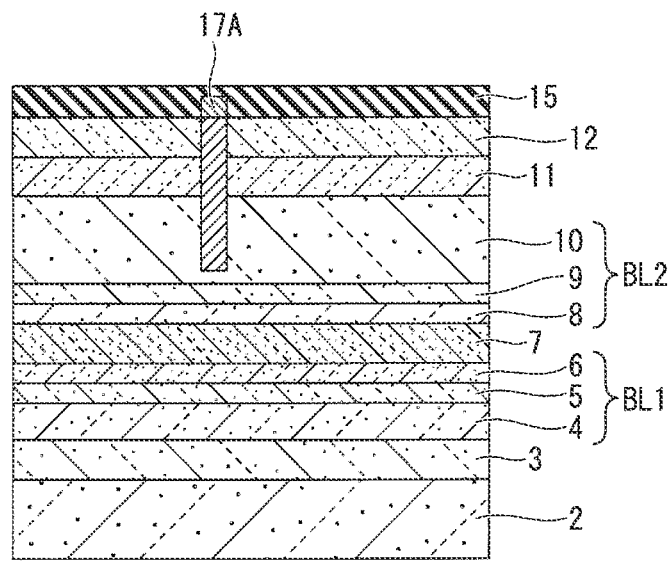
FIG. 6D is a cross-sectional view illustrating the method of manufacturing the compound semiconductor device 1 according to the embodiment (Modification Example 2) of the present disclosure along the order of steps.
Figure 6E:
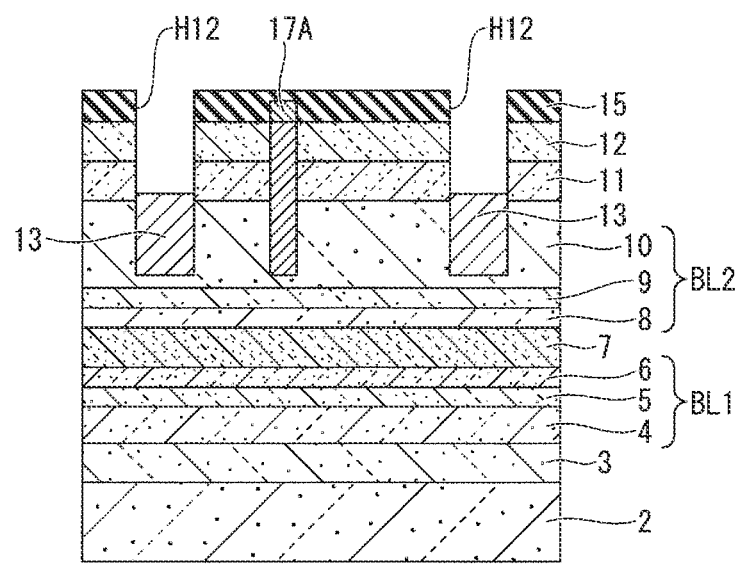
FIG. 6E is a cross-sectional view illustrating the method of manufacturing the compound semiconductor device 1 according to the embodiment (Modification Example 2) of the present disclosure along the order of steps.

Next, as illustrated in FIG. 6D, the manufacturing device forms the first interlayer insulation film 15. Next, as illustrated in FIG. 6E, the manufacturing apparatus forms an opening H12 for exposing the high resistance layer 10 by partially etching the first interlayer insulation film 15, the cap layer 12, and the low resistance layer 11. Next, the manufacturing apparatus forms an ohmic metal layer 13 in the high resistance layer 10 exposed at the bottom part of the opening H12.

Figure 6F:
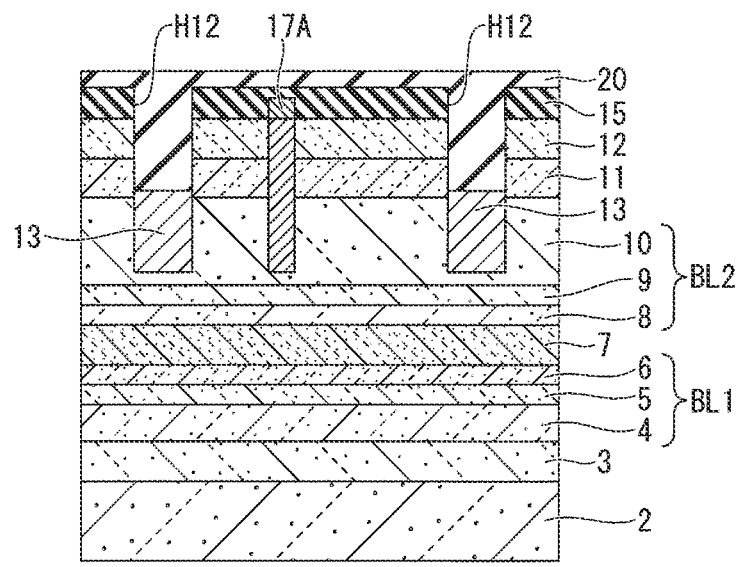
FIG. 6F is a cross-sectional view illustrating the method of manufacturing the compound semiconductor device 1 according to the embodiment (Modification Example 2) of the present disclosure along the order of steps.
Figure 6G:
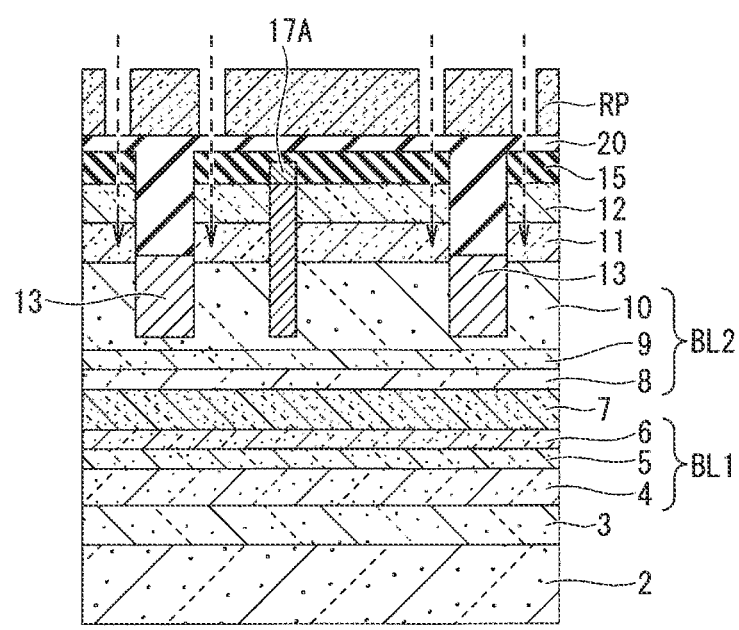
FIG. 6G is a cross-sectional view illustrating the method of manufacturing the compound semiconductor device 1 according to the embodiment (Modification Example 2) of the present disclosure along the order of steps.

Next, as illustrated in FIG. 6F, the manufacturing apparatus forms a second interlayer insulation film 20 so as to fill the opening H12. Next, as illustrated in FIG. 6G, the manufacturing device forms a resist pattern RP on the second interlayer insulation film 20. The resist pattern RP has a shape being opened above the region where the first amorphous layer AM1 and the second amorphous layer AM2 (see FIG. 3) are formed and covering the other areas.

Figure 6H:
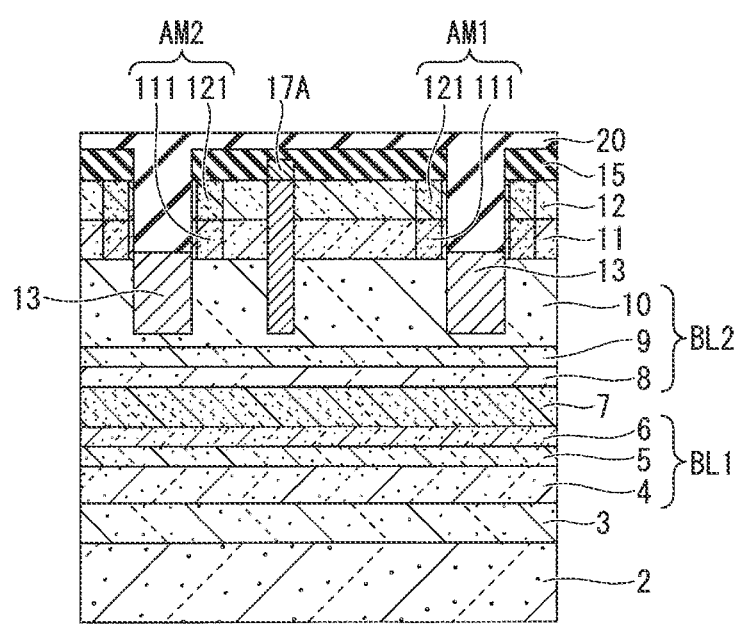
FIG. 6H is a cross-sectional view illustrating the method of manufacturing the compound semiconductor device 1 according to the embodiment (Modification Example 2) of the present disclosure along the order of steps.

Next, the manufacturing apparatus ion-implants an impurity (for example, boron) into the cap layer 12 and the low resistance layer (P-Wing layer) 11 through the second interlayer insulation film 20 using the resist pattern RP as a mask. In this way, as illustrated in FIG. 6H, the manufacturing apparatus partially amorphizes the cap layer 12 and the low resistance layer 11 to form the first amorphous layer AM1 and the second amorphous layer AM2.

Subsequent steps are the same as those of the manufacturing method described earlier with reference to FIG. 4J. That is, as illustrated in FIG. 4J, the manufacturing apparatus forms source, drain, and gate openings, then forms a source electrode 14 in the source opening, a drain electrode 18 in the drain opening, and the upper part 17B of a gate electrode in the gate opening. After that, the manufacturing apparatus forms gate wirings GL, a third interlayer insulation film 24, source wirings SL, and drain wirings DL. The compound semiconductor device 1 illustrated in FIGS. 1 to 3 is completed through the above steps.

Second Embodiment

In the first embodiment, a case where the compound semiconductor device 1 includes a multigate transistor is described. However, embodiments of the present disclosure are not limited thereto. The compound semiconductor device according to an embodiment of the present disclosure may include a single gate transistor instead of a multigate transistor. In the present description, a single gate transistor means a transistor in which the number of gate electrodes is one. For example, a single transistor includes one source electrode 14, one gate electrode 17, and one drain electrode 18.

Figure 7:
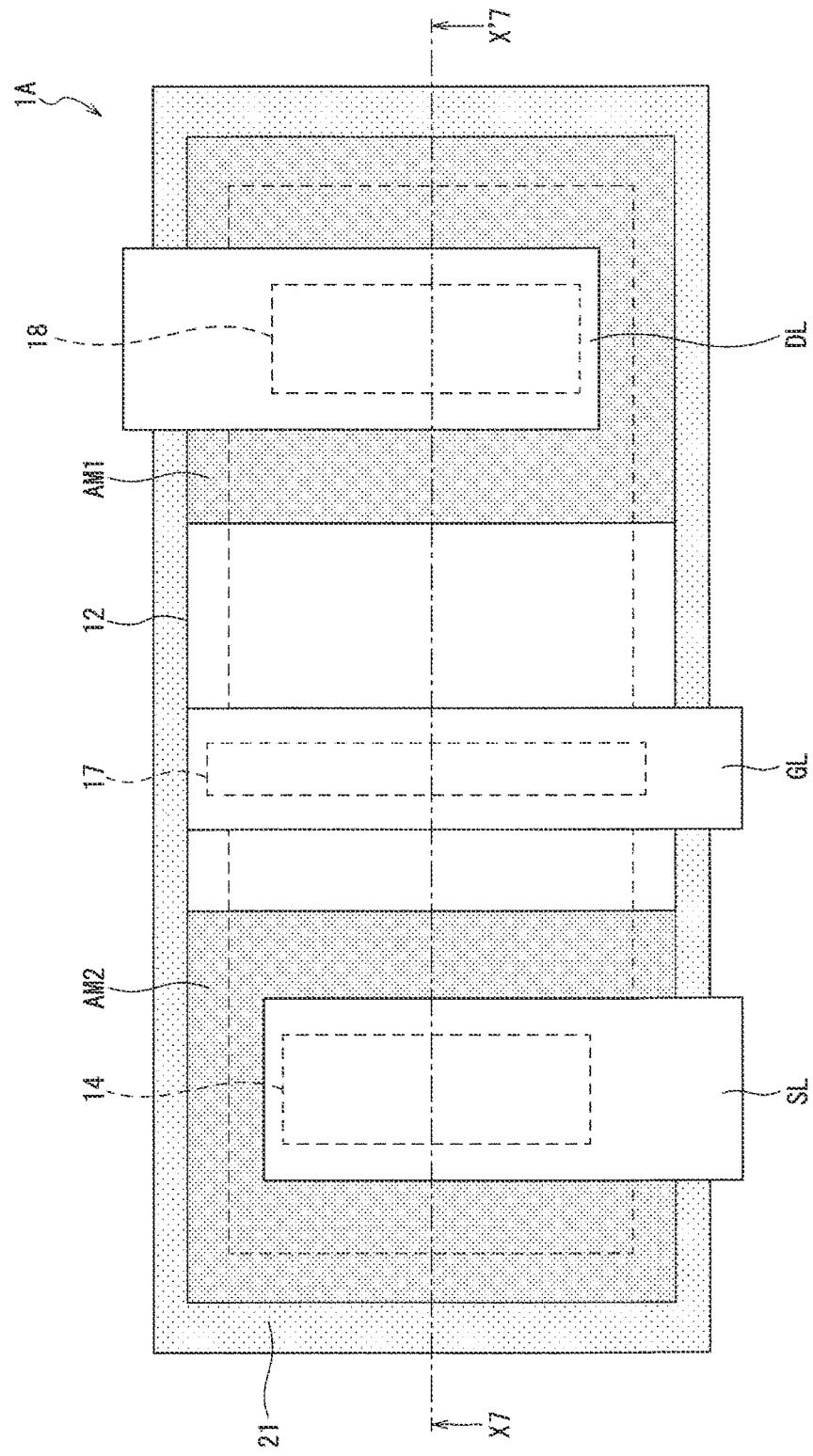
FIG. 7 is a plan view illustrating a configuration example of a compound semiconductor device 1A according to a second embodiment of the present disclosure.
Figure 8:
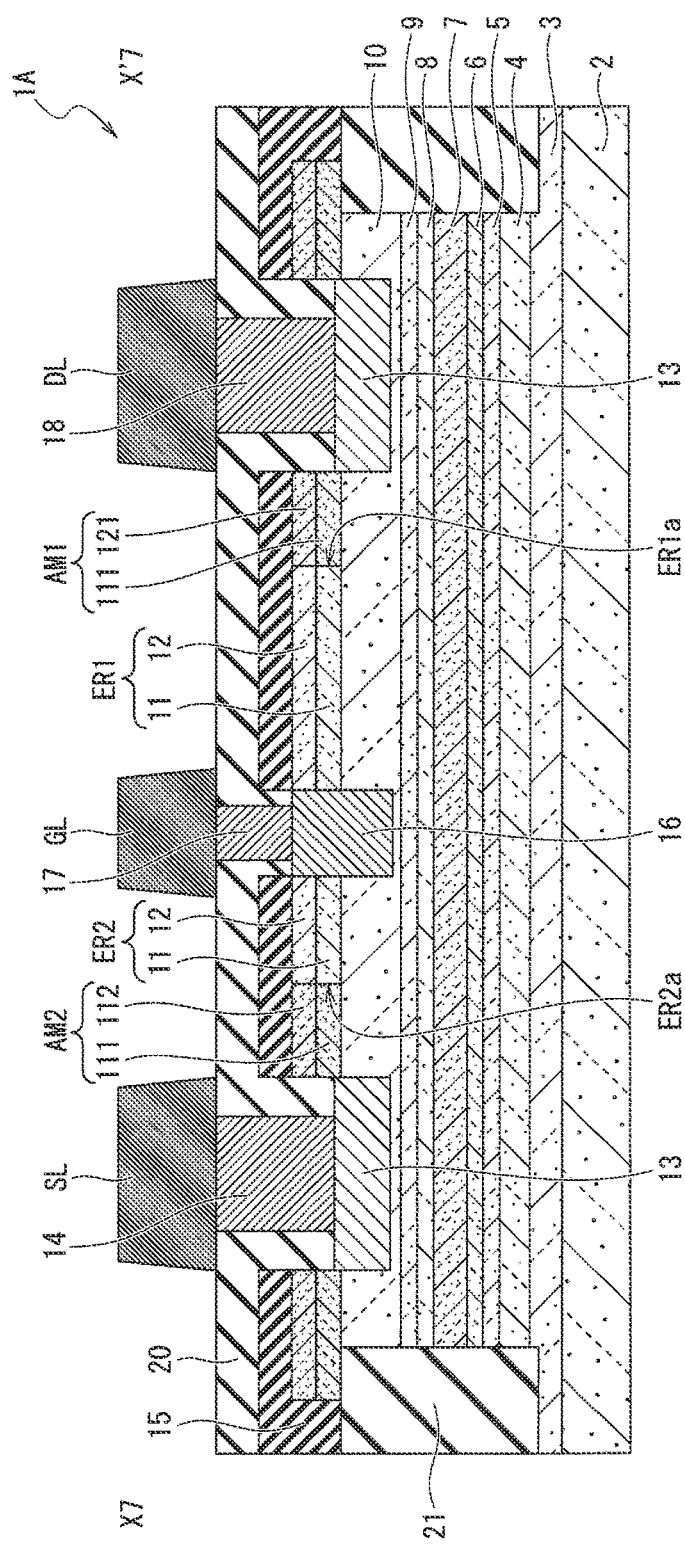
FIG. 8 is a plan view illustrating a configuration example of the compound semiconductor device 1A according to the second embodiment of the present disclosure.

FIG. 7 is a plan view illustrating a configuration example of a compound semiconductor device 1A according to the second embodiment of the present disclosure. FIG. 8 is a cross-sectional view illustrating a configuration example of the compound semiconductor device 1A according to the second embodiment of the present disclosure. FIG. 8 illustrates a cross-section of the plan view illustrated in FIG. 7 taken along line X7-X'7. In FIG. 7, illustrations of the first interlayer insulation film 15, the second interlayer insulation film 20, and the third interlayer insulation film 24, which are illustrated in FIG. 8, are omitted to avoid the complication of the drawings.

As illustrated in FIGS. 7 and 8, the compound semiconductor device 1A includes a single gate transistor with one source electrode 14, one gate electrode 17, and one drain electrode 18. Also, in a single transistor, a first amorphous layer AM1 is provided between the gate electrode 17 and the drain electrode 18, and a second amorphous layer AM2 is provided between the gate electrode 17 and the source electrode 14. In the horizontal direction, the first amorphous layers AM1 are provided on both sides of the drain electrode 18, and the second amorphous layers AM2 are provided on both sides of the source electrode 14.

Even in such a constitution, the first amorphous layer AM1 can prevent hydrogen ions and the like, which are generated due to the process, from being implanted into the inside of the first electric-field relaxation layer ER1 from the first side surface ER1a of the first electric-field relaxation layer ER1 and prevent impurities (for example, carbon or the like) in the first electric-field relaxation layer ER1 from being inactivated by the above hydrogen ions or the like. This enables the compound semiconductor device 1A to stabilize the activation ratio of impurities in the first electric-field relaxation layer ER1.

Similarly, the second amorphous layer AM2 can prevent hydrogen ions and the like, which are generated due to the process, from being implanted into the inside of the second electric-field relaxation layer ER2 from the second side surface ER2a of the second electric-field relaxation layer ER2 and prevent carbon or the like in the second electric-field relaxation layer ER2 from being inactivated by the above hydrogen ions or the like. This enables the compound semiconductor device 1 to stabilize the activation ratio of impurities in the second electric-field relaxation layer ER2.

This enables the compound semiconductor device 1A to relax the electric field concentration to the gate diffusion layer 16 with high reliability and, therefore, enables suppressing the deterioration of element characteristics (such as a pressure resistance reduction due to the electric field concentration to the gate diffusion layer 16).

Modification Example

FIGS. 7 and 8 illustrate an embodiment in which another first amorphous layer AM1 is provided on the opposite side of the drain electrode 18 from the gate electrode 17 in the horizontal direction in addition to the first amorphous layer AM1 provided between the gate electrode 17 and the drain electrode 18. Furthermore, FIGS. 7 and 8 illustrate an embodiment in which another second amorphous layer AM2 is provided on the opposite side of the source electrode 14 from the gate electrode 17 in the horizontal direction in addition to the second amorphous layer AM2 provided between the gate electrode 17 and the source electrode 14. However, the arrangement of the first amorphous layer AM1 and the second amorphous layer AM2 is not limited thereto in embodiments of the present disclosure.

Figure 9:
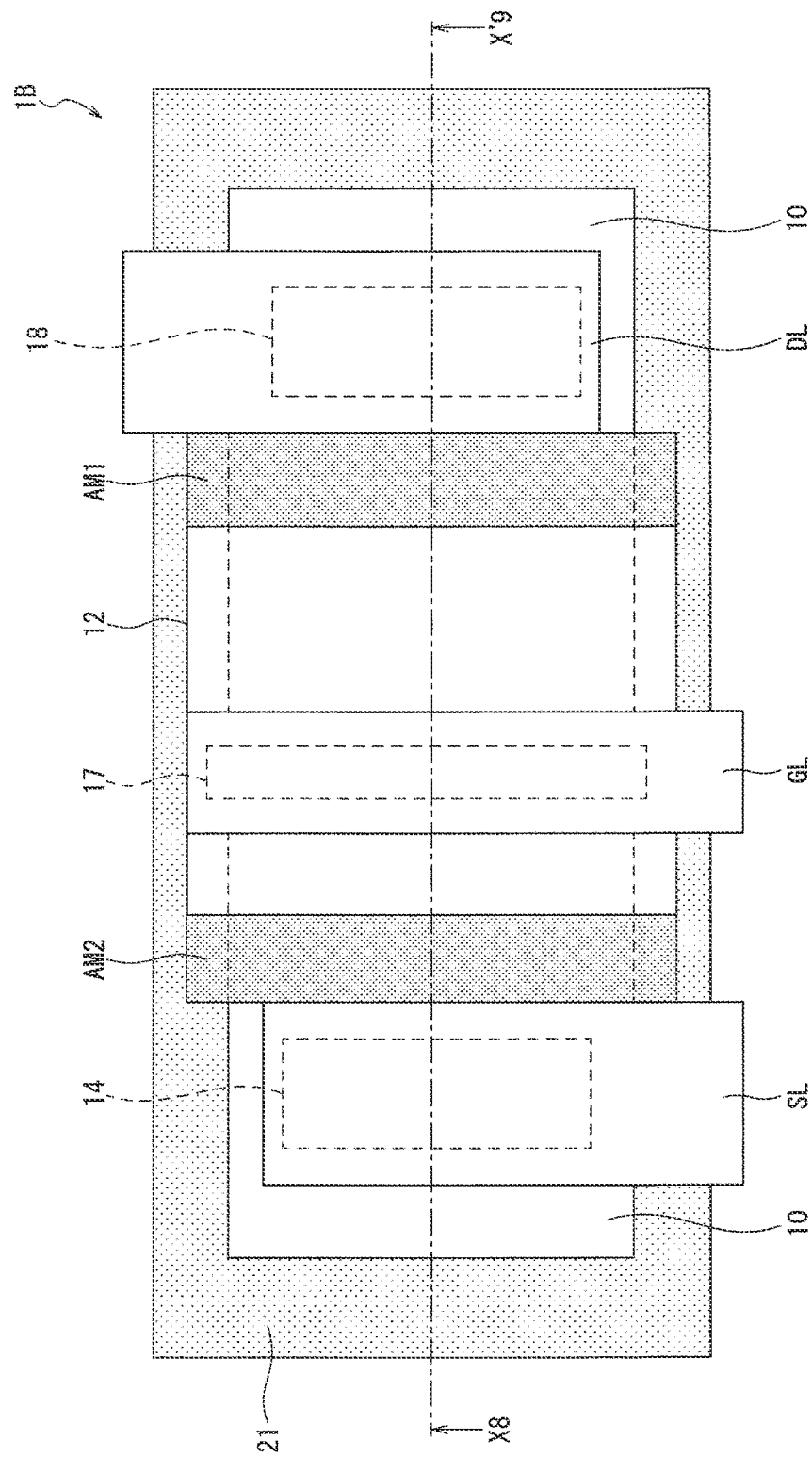
FIG. 9 is a plan view illustrating a configuration of a compound semiconductor device 1B according to a modification example of the second embodiment of the present disclosure.
Figure 10:
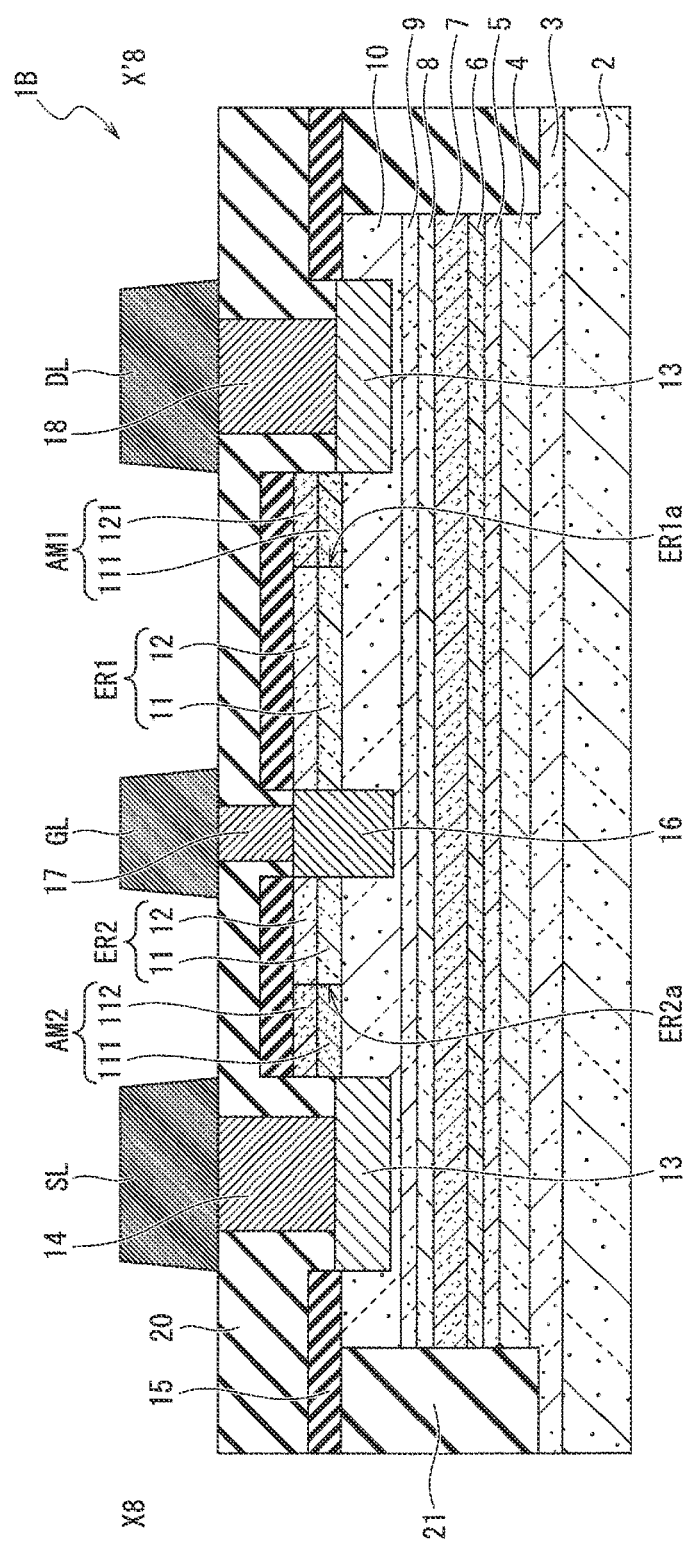
FIG. 10 is a cross-sectional view illustrating a configuration of the compound semiconductor device 1B according to the modification example of the second embodiment of the present disclosure.

FIG. 9 is a plan view illustrating a configuration of the compound semiconductor device 1B according to the modification example of the second embodiment of the present disclosure. FIG. 10 is a cross-sectional view illustrating a configuration of the compound semiconductor device 1B according to the modification example of the second embodiment of the present disclosure. FIG. 10 illustrates a cross-section of the plan view illustrated in FIG. 9 taken along line X9-X'9. In FIG. 9, illustrations of the first interlayer insulation film 15, the second interlayer insulation film 20, and the third interlayer insulation film 24, which are illustrated in FIG. 10, are omitted to avoid the complication of the drawings.

As illustrated in FIGS. 9 and 10, the compound semiconductor device 1B has, in the horizontal direction, a first amorphous layer AM1 provided between the gate electrode 17 and the drain electrode 18 but does not include any first amorphous layer AM1 on the opposite side of the drain electrode 18 from the gate electrode 17. Furthermore, the compound semiconductor device 1B has, in the horizontal direction, a second amorphous layer AM2 provided between the gate electrode 17 and the source electrode 14 but does not include any second amorphous layer AM2 on the opposite side of the source electrode 14 from the gate electrode 17.

Even in such a constitution, the first amorphous layer AM1 can prevent hydrogen ions and the like, which are generated due to the process, from being implanted into the inside of the first electric-field relaxation layer ER1 from the first side surface ER1a of the first electric-field relaxation layer ER1 and prevent carbon or the like in the first electric-field relaxation layer ER1 from being inactivated by the above hydrogen ions or the like. Similarly, the second amorphous layer AM2 can prevent generated hydrogen ions or the like from being implanted into the inside of the second electric-field relaxation layer ER2 from the second side surface ER2a of the second electric-field relaxation layer ER2 and prevent carbon or the like in the second electric-field relaxation layer ER2 from being inactivated by the above hydrogen ions or the like. This enables the compound semiconductor device 1B to suppress the deterioration of element characteristics as with the compound semiconductor device 1A.

Other Embodiments

While the present disclosure has been described thus far in the form of embodiments and modification examples, the statements and drawings that constitute parts of this disclosure are not intended to be understood as limiting the present disclosure. It is to be understood that various alternative embodiments, examples, and operable techniques will become apparent from this disclosure to those skilled in the art. For example, it is described that the compound semiconductor devices 1, 1A, and 1B each have both first electric-field relaxation layer ER1 and second electric-field relaxation layer ER2, but the devices may only have either one of them. In this manner, it is of course that the present technology includes various embodiments and the like that are not described herein. At least one of various omissions, substitutions and modifications of components may be performed without departing from the gist of the embodiments and the modification examples described above. Furthermore, the effects described in the present description are merely exemplary and not intended to be limiting, and other effects may be provided as well.

Meanwhile, the present disclosure can also take the following constitutions.

(1) A compound semiconductor device including: a laminated body constituted of a compound semiconductor and including a channel layer in which a first conductivity type carrier runs;

a gate electrode provided on an upper surface side of the laminated body;

a source electrode provided on the upper surface side of the laminated body; and a drain electrode provided on the upper surface side of the laminated body, the laminated body including a second conductivity type first low resistance layer that is provided at a position facing the gate electrode and is in contact with the gate electrode, a first electric-field relaxation layer extended from the first low resistance layer toward a side of one of the source electrode and the drain electrode and configured to relax electric field concentration to the first low resistance layer, and a first amorphous layer covering a first side surface that is a side surface of the first electric-field relaxation layer and faces one of the source electrode and the drain electrode.

(2) The compound semiconductor device according to the above (1) wherein, the laminated body includes a second electric-field relaxation layer extended from the first low resistance layer toward a side of the other of the source electrode and the drain electrode and configured to relax electric field concentration to the first low resistance layer, and a second amorphous layer covering a second side surface that is a side surface of the second electric-field relaxation layer and faces the other of the source electrode and the drain.

(3) The compound semiconductor device according to the above (2), wherein the first electric-field relaxation layer and the second electric-field relaxation layer each include a second conductivity type second low resistance layer provided in contact with the first low resistance layer and having a lower second conductivity type impurity concentration than the first low resistance layer and a high resistance layer provided on the second low resistance layer and having a higher electric resistance than the second low resistance layer.

(4) The compound semiconductor device according to the above (3), wherein the second low resistance layer contains at least one of carbon and magnesium as second conductivity type impurities.

(5) The compound semiconductor device according to the above (3) or (4), wherein the first amorphous layer and the second amorphous layer each include
a first layer containing an identical material to the second low resistance layer, and
a second layer provided on the first layer and containing an identical material to the high resistance layer.

(6) The compound semiconductor device according to any one of the above (2) to (5), further including
a first margin portion provided between the first amorphous layer and one of the source electrode and the drain electrode and adjacent to the first amorphous layer, and
a second margin portion provided between the second amorphous layer and the other of the source electrode and the drain electrode and adjacent to the second amorphous layer,
the first margin portion having an identical structure to the first electric-field relaxation layer, and
the second margin portion having an identical structure to the second electric-field relaxation layer.

(7) A method of manufacturing a compound semiconductor device, including:
a step of forming a laminated body constituted of a compound semiconductor and including a channel layer in which a first conductivity type carrier runs;
a step of forming a gate electrode on an upper surface side of the laminated body;
a step of forming a source electrode provided on the upper surface side of the laminated body; and
a step of forming a drain electrode provided on the upper surface side of the laminated body,
the step of forming a laminated body including
a step of forming a second conductivity type first low resistance layer that is placed at a position facing the gate electrode and is in contact with the gate electrode,
a step of forming a first electric-field relaxation layer extended from the first low resistance layer toward a side of one of the source electrode and the drain electrode and configured to relax electric field concentration to the first low resistance layer, and
a step of forming a first amorphous layer so as to cover a first side surface that is a side surface of the first electric-field relaxation layer and faces one of the source electrode and the drain electrode,
the step of forming a first amorphous layer including
forming the first amorphous layer by ion-implanting an impurity into part of the first electric-field relaxation layer to amorphize.

REFERENCE SIGNS LIST 1, 1A, 1B Compound semiconductor device
2 Substrate
3 Buffer layer
4 High resistance layer
5 Carrier supply layer
6, 8, 10 High resistance layer
7 Channel layer
9 Carrier supply layer
11 Low resistance layer (P-Wing layer)
12 Cap layer
13 Ohmic metal layer
14 Source electrode
15 First interlayer insulation film
16 Gate diffusion layer
17 Gate electrode
17A Lower part
17B Upper part
18 Drain electrode
20 Second interlayer insulation film
24 Third interlayer insulation film
31 Insulation film
111 Lower layer
121 Upper layer
AM1 First amorphous layer
AM2 Second amorphous layer
BL1 Lower barrier layer
BL2 Upper barrier layer
DL Drain wiring
ER1 First electric-field relaxation layer
ER1a First side surface
ER2 Second electric-field relaxation layer
ER2a Second side surface
GL Gate wiring
H11, H12 Opening
MR1 First margin portion
MR2 Second margin portion
SL Source wiring

The invention claimed is:

1. A compound semiconductor device, comprising: a laminated body constituted of a compound semiconductor and including a channel layer in which a first conductivity type carrier runs;
a gate electrode provided on an upper surface side of the laminated body;
a source electrode provided on the upper surface side of the laminated body; and
a drain electrode provided on the upper surface side of the laminated body,
the laminated body including:
a second conductivity type first low resistance layer that is provided at a position facing the gate electrode and is in contact with the gate electrode,
a first electric-field relaxation layer extended from the second conductivity type first low resistance layer toward a side of one of the source electrode and the drain electrode and configured to relax electric field concentration to the second conductivity type first low resistance layer, and
a first amorphous layer covering a first side surface that is a side surface of the first electric-field relaxation layer and faces one of the source electrode and the drain electrode.

2. The compound semiconductor device according to claim 1, wherein
the laminated body includes:
a second electric-field relaxation layer extended from the second conductivity type first low resistance layer toward a side of the other of the source electrode and the drain electrode and configured to relax electric field concentration to the second conductivity type first low resistance layer, and
a second amorphous layer covering a second side surface that is a side surface of the second electric-field relaxation layer and faces the other of the source electrode and the drain electrode.

3. The compound semiconductor device according to claim 2, wherein each of the first electric-field relaxation layer and the second electric-field relaxation layer includes:
a second conductivity type second low resistance layer provided in contact with the second conductivity type first low resistance layer and having a lower second conductivity type impurity concentration than the second conductivity type first low resistance layer, and a high resistance layer provided on the second conductivity type second low resistance layer and having a higher electric resistance than the second conductivity type second low resistance layer.

4. The compound semiconductor device according to claim 3, wherein the second conductivity type second low resistance layer contains at least one of carbon and magnesium as second conductivity type impurities.

5. The compound semiconductor device according to claim 3, wherein each of the first amorphous layer and the second amorphous layer includes:
   a first layer containing an identical material to the second conductivity type second low resistance layer, and
   a second layer provided on the first layer and containing an identical material to the high resistance layer.

6. The compound semiconductor device according to claim 2, further comprising:
   a first margin portion provided between the first amorphous layer and one of the source electrode and the drain electrode and adjacent to the first amorphous layer, and
   a second margin portion provided between the second amorphous layer and the other of the source electrode and the drain electrode and adjacent to the second amorphous layer,
   the first margin portion having an identical structure to the first electric-field relaxation layer, and
   the second margin portion having an identical structure to the second electric-field relaxation layer.

* * * * *